(12) United States Patent
Sun et al.

(10) Patent No.: US 9,257,525 B2
(45) Date of Patent: Feb. 9, 2016

(54) SYSTEMS AND METHODS FOR FORMING ISOLATED DEVICES IN A HANDLE WAFER

(75) Inventors: I-Shan Sun, San Jose, CA (US); Rick Carlton Jerome, Indialantic, FL (US); Francois Hebert, San Mateo, CA (US)

(73) Assignee: Intersil Americas LLC, Milpitas, CA (US)

( * ) Notice: Subject to any disclaimer, the term of this patent is extended or adjusted under 35 U.S.C. 154(b) by 1090 days.

(21) Appl. No.: 13/283,139

(22) Filed: Oct. 27, 2011

(65) Prior Publication Data

US 2012/0288083 A1 Nov. 15, 2012

Related U.S. Application Data

(60) Provisional application No. 61/485,897, filed on May 13, 2011.

(51) Int. Cl.
| | | |
|---|---|---|
| H01L 21/00 | (2006.01) | |
| H01L 29/66 | (2006.01) | |
| H01L 23/48 | (2006.01) | |
| H01L 23/535 | (2006.01) | |
| H01L 21/74 | (2006.01) | |
| H01L 27/06 | (2006.01) | |

(52) U.S. Cl.
CPC ........ H01L 29/66204 (2013.01); H01L 21/743 (2013.01); H01L 23/481 (2013.01); H01L 23/535 (2013.01); H01L 27/0688 (2013.01); H01L 2924/0002 (2013.01)

(58) Field of Classification Search
CPC ............... H01L 29/7813; H01L 29/41766; H01L 29/66734; H01L 29/1095; H01L 29/456; H01L 29/4236; H01L 2924/0002; H01L 2924/00; H01L 21/743; H01L 23/481; H01L 23/535; H01L 27/0688; H01L 29/66204
USPC ............ 438/107; 257/774, E21.499, E23.011
See application file for complete search history.

(56) References Cited

U.S. PATENT DOCUMENTS

| | | | | |
|---|---|---|---|---|
| 6,724,043 | B1 * | 4/2004 | Ekkanath et al. ..... | H01L 29/749 257/133 |
| 2005/0118768 | A1 * | 6/2005 | Chen ............................. | 438/301 |

(Continued)

OTHER PUBLICATIONS

"DSL01-xxxSC5 Secondary protection for DSL lines", Jun. 2010, pp. 1-8, Publisher: STMicroelectronics.
Bobde et al, "A Novel ESD Super-Clamp Structure for TVS Applications", Feb. 2008, pp. 1-4, Publisher: Alpha & Omega Semiconductor, Inc.

(Continued)

*Primary Examiner* — Duy T Nguyen
(74) *Attorney, Agent, or Firm* — Fogg & Powers LLC

(57) ABSTRACT

A method for through active-silicon via integration is provided. The method comprises forming an electrical device in a handle wafer. The method also comprises forming an isolation layer over the handle wafer and the electrical device and joining an active layer to the isolation layer. Further, the method comprises forming at least one trench through the active layer and the isolation layer to expose a portion of the handle wafer and depositing an electrically conductive material in the at least one trench, the electrically conductive material providing an electrical connection to the electrical device through the active layer.

15 Claims, 23 Drawing Sheets

(56) References Cited

U.S. PATENT DOCUMENTS

| | | |
|---|---|---|
| 2005/0184326 A1* | 8/2005 | Cheng .......................... 257/301 |
| 2007/0080387 A1* | 4/2007 | Liu et al. ...................... 257/303 |
| 2009/0111223 A1* | 4/2009 | Wiatr et al. .................. 438/155 |
| 2010/0032811 A1 | 2/2010 | Ding et al. |
| 2010/0244090 A1 | 9/2010 | Bobde |
| 2010/0276786 A1 | 11/2010 | Cotte et al. |
| 2011/0049621 A1* | 3/2011 | Lotfi ............... H01L 21/823807 257/337 |
| 2011/0266691 A1* | 11/2011 | Lin et al. ...................... 257/774 |

OTHER PUBLICATIONS

Chan et al., "SOI/Bulk Hybrid Technology on SIMOX Wafers for High Performance Circuits with Good ESD Immunity", Jan. 1995, pp. 11-13, vol. 16, No. 1, Publisher: IEEE Electron Device Letters.

Taiwan Intellectual Property Office, "Office Action from TW Application No. 101104308 mailed Sep. 17, 2015", "from Foreign Counterpart of U.S. Appl. No. 13/283,139", Sep. 17, 2015, pp. 1-15, Published in: TW.

\* cited by examiner

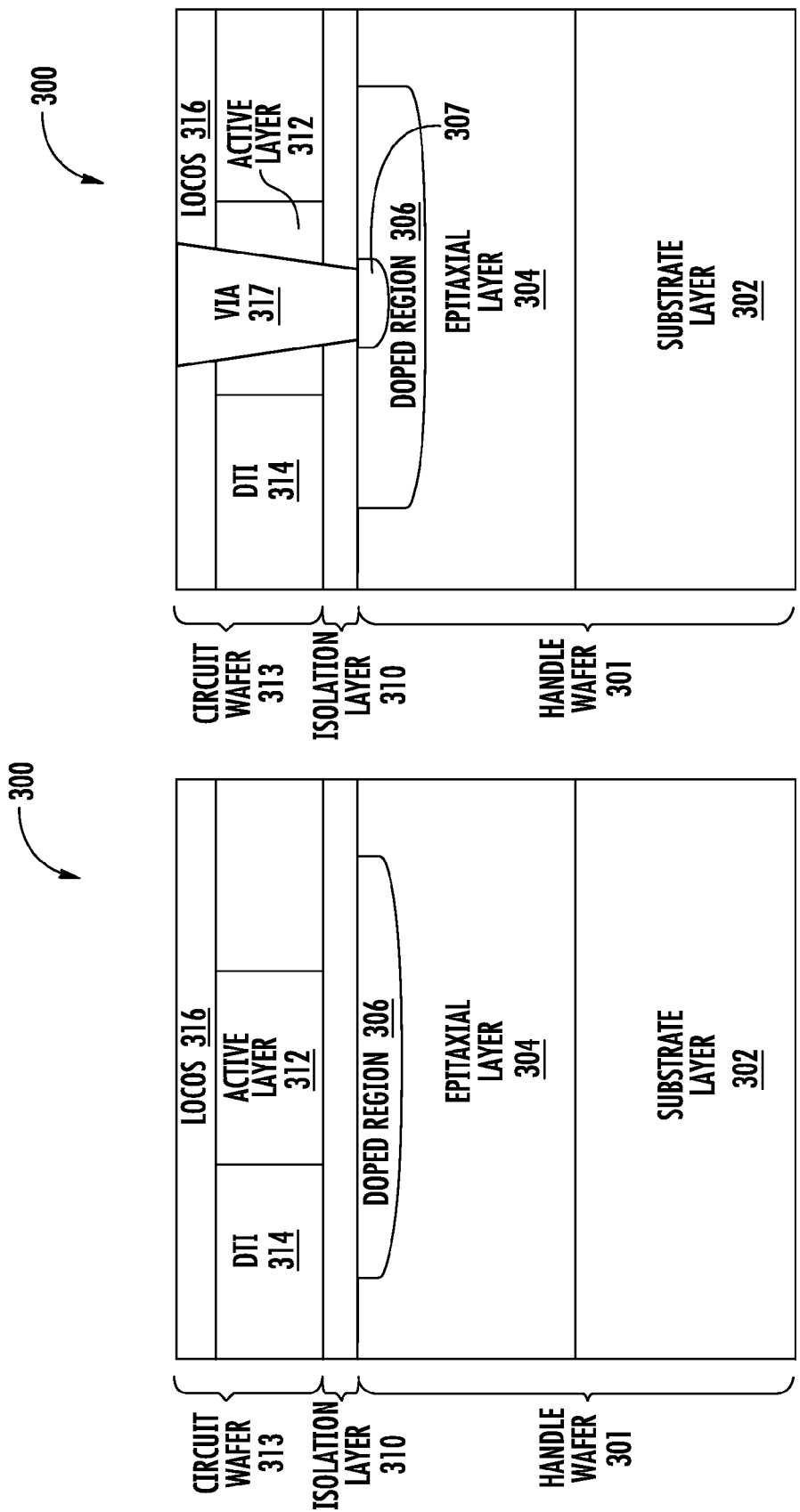

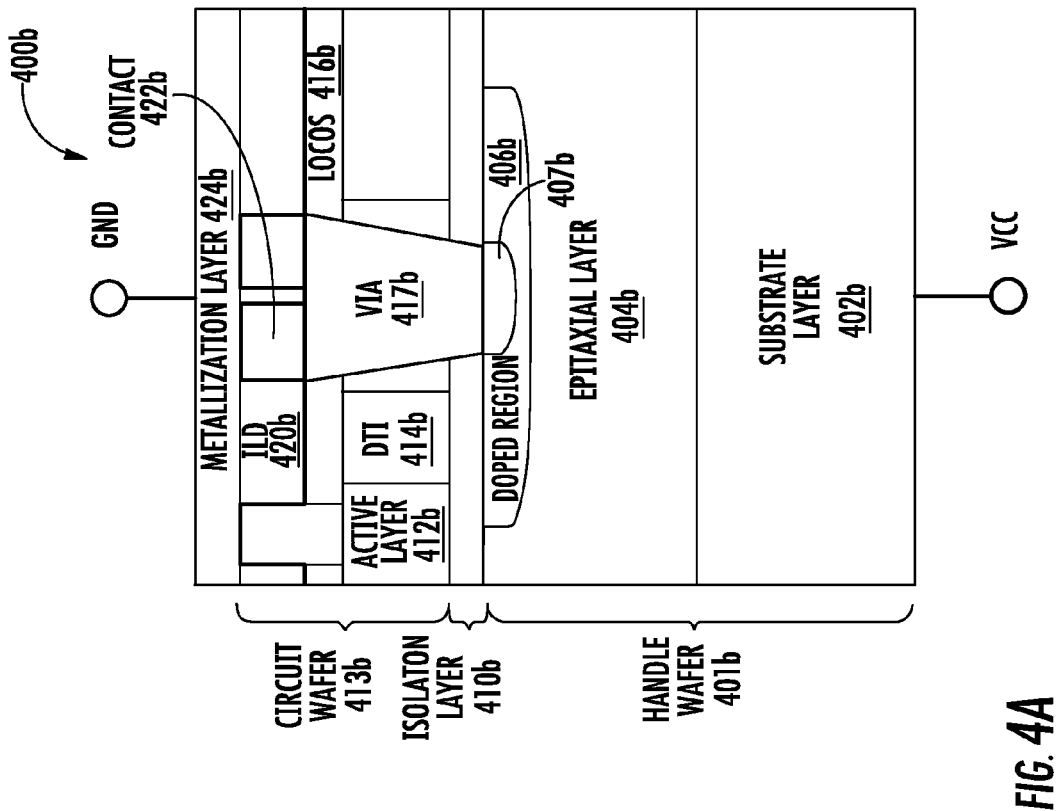
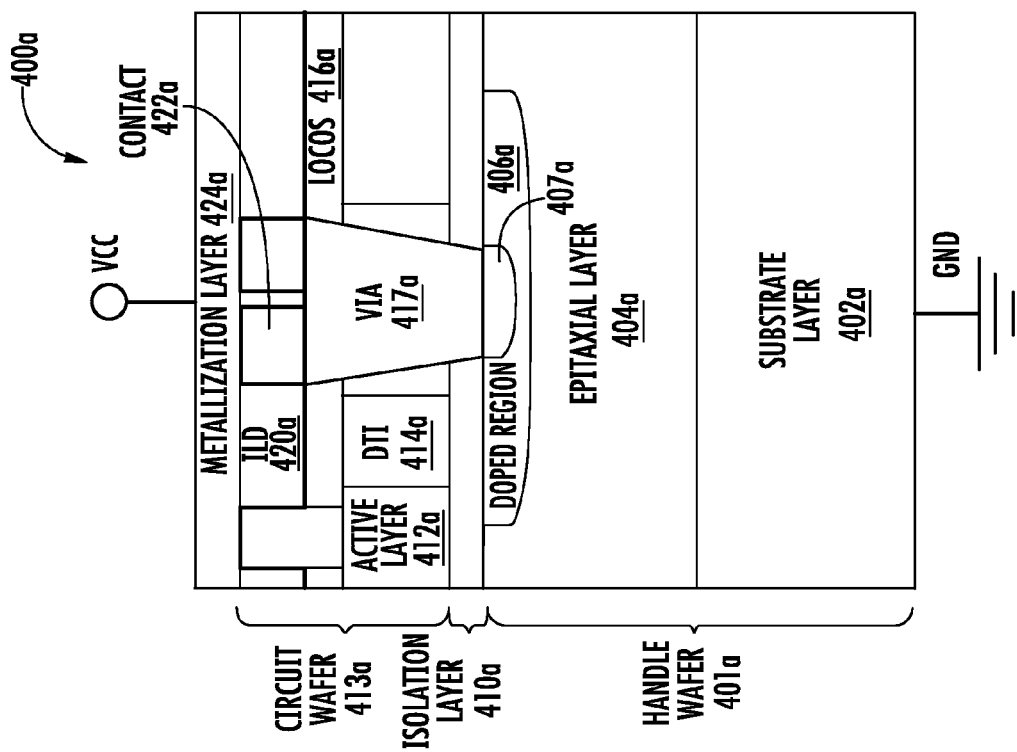
FIG. 4A

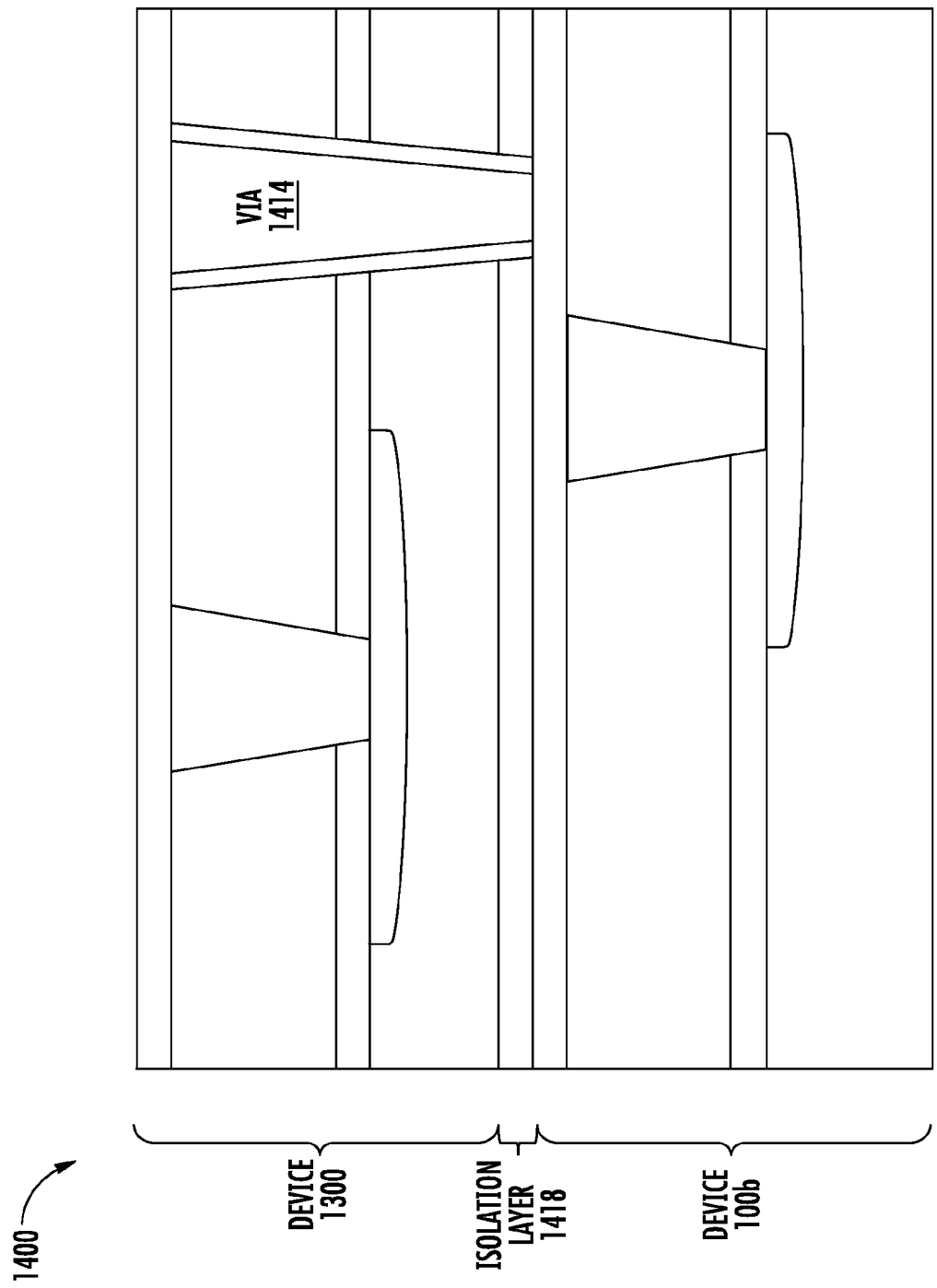

SYSTEMS AND METHODS FOR FORMING ISOLATED DEVICES IN A HANDLE WAFER

CROSS REFERENCE TO RELATED APPLICATIONS

This application claims the benefit of priority to U.S. Provisional Application No. 61/485,897, filed on May 13, 2011, the disclosure of which is incorporated herein by reference.

DRAWINGS

Understanding that the drawings depict only exemplary embodiments and are not therefore to be considered limiting in scope, the exemplary embodiments will be described with additional specificity and detail through the use of the accompanying drawings in which:

FIGS. 3A-3E are block diagrams illustrating one embodiment of a process for forming a diode in a handle wafer.

FIGS. 4A-4B are block diagrams illustrating embodiments of diodes formed in a handle wafer.

FIG. 14 is a block diagram illustrating one embodiment of devices formed in handle wafers and arranged in a stacked configuration.

Figure 1:
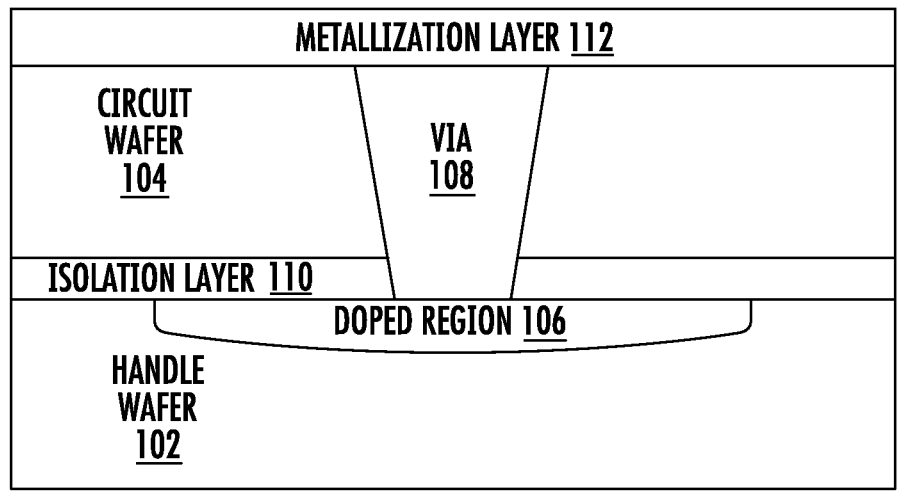
FIG. 1 is a block diagram of one embodiment of a device formed in a handle wafer.

In accordance with common practice, the various described features are not drawn to scale but are drawn to emphasize specific features relevant to the exemplary embodiments.

DETAILED DESCRIPTION

In the following detailed description, reference is made to the accompanying drawings that form a part hereof, and in which is shown by way of illustration specific illustrative embodiments. However, it is to be understood that other embodiments may be utilized and that logical, mechanical, and electrical changes may be made. Furthermore, the method presented in the drawing figures and the specification is not to be construed as limiting the order in which the individual acts may be performed. The following detailed description is, therefore, not to be taken in a limiting sense.

FIG. 1 is a block diagram illustrating one embodiment of a electrical device 100. In certain embodiments, electrical device 100 is formed as an integrated circuit. When electrical device 100 is formed as an integrated circuit, electrical device 100 includes a handle wafer 102, an isolation layer 110, and a circuit wafer 104. Handle wafer 102 provides structural strength to the integrated circuit and circuit wafer 104 generally contains multiple layers that form multiple semiconductor devices that constitute a portion of an integrated circuit. Isolation layer 110 electrically insulates circuit wafer 104 from handle wafer 102. Further, electrical device 100 includes a metallization layer 112 to provide electrical connections between the semiconductor devices contained in the circuit wafer 104. In at least one embodiment, handle wafer 101, isolation layer 110, and circuit wafer 104 are fabricated using silicon on insulator technology.

In certain embodiments, handle wafer 102 is fabricated from semiconductor material such as germanium, silicon, and the like. Further, handle wafer 102 can include multiple layers of semiconductors having differently doped silicon. For example, the handle wafer 102 can include a P+ doped semiconductor substrate, with a P− doped epitaxial layer formed on top of the semiconductor substrate. Further, in certain embodiments, handle wafer 102 includes semiconductor devices. For example, doped region 106 represents a region of handle wafer 102 that has been doped to form a semiconductor device in handle wafer 102. Different semiconductor devices can be formed by using doped region 106 in handle wafer 102 such as diffusion resistors, capacitors, BJTs, FETs and the like. Further, multiple semiconductor devices can be formed in handle wafer 102 using multiple doped regions.

In further embodiments, isolation layer 110 isolates the electrical device formed by doped region 106 in the handle wafer 102 from semiconductor devices formed in circuit wafer 104. For example, isolation layer 110 is a bonded oxide layer, and the like. When isolation layer 110 is formed between the handle wafer 102 and the circuit wafer 104, the isolation layer 110 electrically insulates semiconductor devices formed in handle wafer 102 from semiconductor devices formed in circuit wafer 104. The isolation of handle wafer 102 from circuit wafer 104 allows semiconductor devices to be more efficiently fabricated on top of one another while preventing the operation of a semiconductor device formed by doped region 106 from interfering with semiconductor devices formed in circuit wafer 104. For example, when the semiconductor device formed in handle wafer 102 is a large diode, isolation layer 110 will prevent the large diode from negatively impacting the operation of semiconductor devices formed in circuit wafer 104 and the large diode can be up to the size of the surface area of handle wafer 102. Further, in some embodiments, a via 108 extends through isolation layer 110 to connect doped region 106 to metallization layer 112 and circuit wafer 104.

In at least one embodiment, the circuit wafer 104 includes different layers and sections that contain, and connect semiconductor devices. For example, circuit wafer 104 can include an inter metal dielectric, electrical contacts, doped regions, and the like. In some embodiments, a via 108 is formed through circuit wafer 104, and isolation layer 110 to provide an electrical connection to doped region 106 formed in handle wafer 102. Via 108 is a conductive material that extends through circuit wafer 104 and electrically connects doped region 106 to the top surface of circuit wafer 104 and to semiconductor devices formed in the circuit wafer 104. In some embodiments, metallization layer 112, deposited on top of circuit wafer 104, also electrically connects to via 108. Because via 108 electrically connects to metallization layer 112, doped region 106 can electrically connect to other semiconductor devices formed in circuit wafer 104 that are not electrically connected to via 108 through circuit wafer 104.

Figure 2:
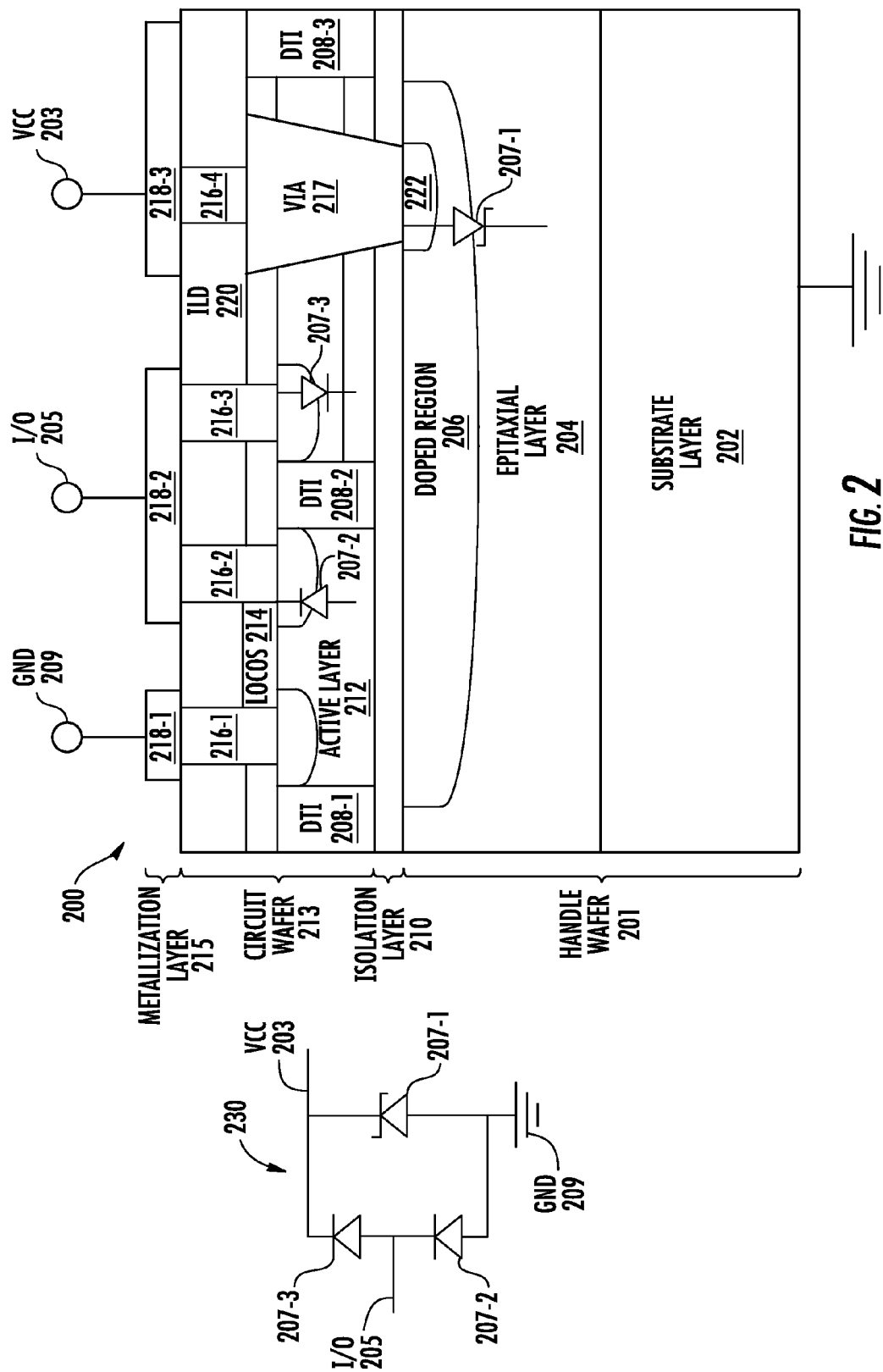
FIG. 2 is a block diagram illustrating one embodiment of transient voltage suppression diodes with a diode formed in a handle wafer.

FIG. 2, is a block diagram illustrating one embodiment of a transient voltage suppression (TVS) circuit where at least one device is formed in a handle wafer. Integrated circuit 200 implements TVS circuit 230 having multiple diodes 207-1-207-3 forming at least one of the diodes in a handle wafer 201. The implemented diodes include a zener diode 207-1, a first clamping diode 207-2, and a second clamping diode 207-3. As shown in circuit 230, first clamping diode 207-3 connects to a voltage source (VCC) 203 and the second clamping diode 207-2 connects to ground 209. An input/output (I/O) 205 connects between first clamping diode 207-3 and second clamping diode 207-2. Zener diode 207-1 is parallel to first clamping diode 207-3 and second clamping diode 207-2 and connected between ground and the voltage source. In this particular exemplary embodiment, integrated circuit 200 implements circuit 230 by forming zener diode 207-1 in the handle wafer 201, and forming first clamping diode 207-3, and second clamping diode 207-2 in an active layer 212 in circuit wafer 213.

In some embodiments, handle wafer 201 includes multiple doped layers like a substrate layer 202 and an epitaxial layer 204, where substrate layer 202 supports epitaxial layer 204. In certain embodiments, substrate layer 202 and epitaxial layer 204 have similar polarities but at different levels of doping. For example, substrate layer 202 is a doped N+ substrate and epitaxial layer 204 is a N− epitaxial layer. Alternatively, and as shown when implementing circuit 230, substrate layer 202 is a doped P+ substrate and epitaxial layer 204 is a P− epitaxial layer. Integrated circuit 200 also includes a doped region 206, which, in this embodiment, is formed with a doped material having a polarity that is opposite to the polarity of the substrate layer 202. For example, when substrate layer 202 is a P+ substrate, doped region 206 is formed by doping material in epitaxial layer 204 with N+ doping. Further, doped region 206 includes a heavily doped region 222 that functions, in conjunction with doped region 206 as zener diode 207-1. Heavily doped region 222 is of the same polarity as doped region 206 but is more heavily doped to improve electrical contacts with conductive materials like metal. Above doped region 206, an isolation layer 210 isolates heavily doped region 222, doped region 206, substrate layer 202, and epitaxial layer 204 from a circuit wafer 213 supported by substrate layer 202. In some implementations, isolation layer 210 is a bonded oxide layer that bonds the handle wafer 201 to the circuit wafer 213.

In a further embodiment, above isolation layer 210, circuit wafer 213 contains multiple layers used to form an integrated circuit. For example, circuit wafer 213 includes an active layer 212, deep trench isolators (DTIs) 208-1-208-3, a local oxidation of silicon (LOCOS) layer 214, and an inter-layer dielectric (ILD) layer 220. Active layer 212 is a semiconductor layer that contains multiple electrical devices. The semiconductors of active layer 212 are formed using material like silicon, germanium, and the like. In certain implementations, diodes 207-2 and 207-3 are formed in active layer 212. Further, devices formed within active layer 212 are isolated from one another using DTIs 208-1-208-3 to prevent devices from electrically contacting other devices through the electrically conductive active layer 212. In this particular exemplary embodiment, DTI 208-2 electrically isolates diode 207-2 from diode 207-3 within active layer 212 and DTIs 208-1 and 208-3 isolate circuit 230 from other electrical devices formed in active layer 212.

In certain embodiments, the different devices in active layer 212 are formed before active layer 212 is bonded to isolation layer 210. Alternatively, the different devices are formed after active layer 212 is bonded to bonding layer 210. For example, diodes 207-2-207-3 are formed in active layer 212 by implanting doped contact regions in active layer 212 with a material having a different polarity than the material used to form active layer 212. In one implementation, the portion of active layer 212 containing diode 207-3 has a p− polarity, while the contact region for diode 207-3 has a N+ polarity.

To further electrically insulate the diodes from one another and to insulate the diodes from other electronic devices, LOCOS layer 214 is formed on top of DTIs 208-1-208-3 and active layer 212. To connect zener diode 207-1 to other electronic devices in the circuit wafer 213, a trench is formed through LOCOS layer 214, active layer 212 and isolation layer 210 to expose a portion of doped region 206 that forms zener diode 207-1. When the portion of doped region 206 is exposed, the portion of doped region 206 can be more heavily doped to form heavily doped region 222 to facilitate electrical conductivity. Further, conductive material is deposited within the trench to form a via 217 that extends from heavily doped region 222 to the top surface of LOCOS layer 214.

In a further embodiment, ILD layer 220 is formed above LOCOS layer 214 and contact trenches are formed through ILD layer 220 and LOCOS layer 214 to expose contact regions on active layer 212. The contact regions on active layer 212 are regions that connect to electrical devices found in active layer 212. For example, the contact region is an exposed electrical device or an exposed via (such as via 217) that connects to an electrical device. When the contact regions are exposed, the contact trenches are filled with electrically conductive material to form electrical contacts 216-1-216-4 between the contact regions on active layer 212 and the top surface of ILD layer 220. The electrical connections provided by the contact trenches connect to terminals 218-1-218-3 formed as portions of a metallization layer 215 formed on top of ILD layer 220, where terminals 218-1-218-3 connect the diodes 207-1-207-3 to each other, other circuitry formed in an integrated circuit, and other circuits. For example, terminal 218-1 connects diode 207-2 to a ground (GND) 209, terminal 218-2 connects diodes 207-2 and 207-3 to an input/output 205, and terminal 218-3 connects diode 207-1 and 207-3 to a voltage source 203.

By fabricating electrical devices like diode 207-1 in handle wafer 201, a clamping diode can be fabricated to be as large as handle wafer 201 itself, without adding significantly to the active surface area of an integrated circuit. Also, the diode can be tailored to specific required ESD/Surge tolerances without latch-up or isolation issues associated with the designs of other circuitry in active layer 212. Further, the use of diodes 207-2 and 207-3 in active layer 212 ensures low capacitance is added to the input/output terminal within a compact integration scheme to cause the steering diodes to function with diode 207-1 formed in handle wafer 201.

Figure 3B:
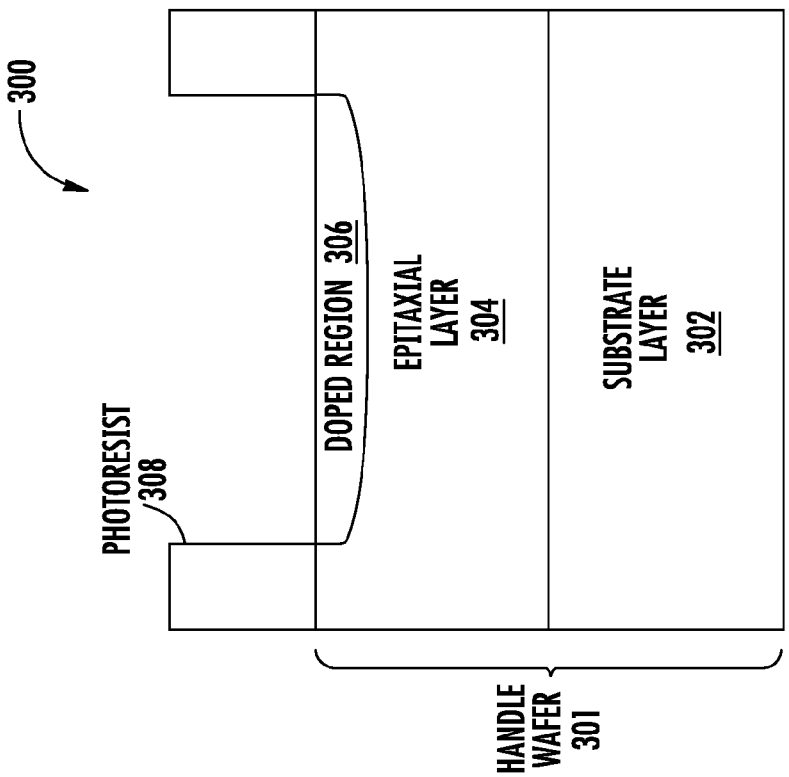
Figure 3A:
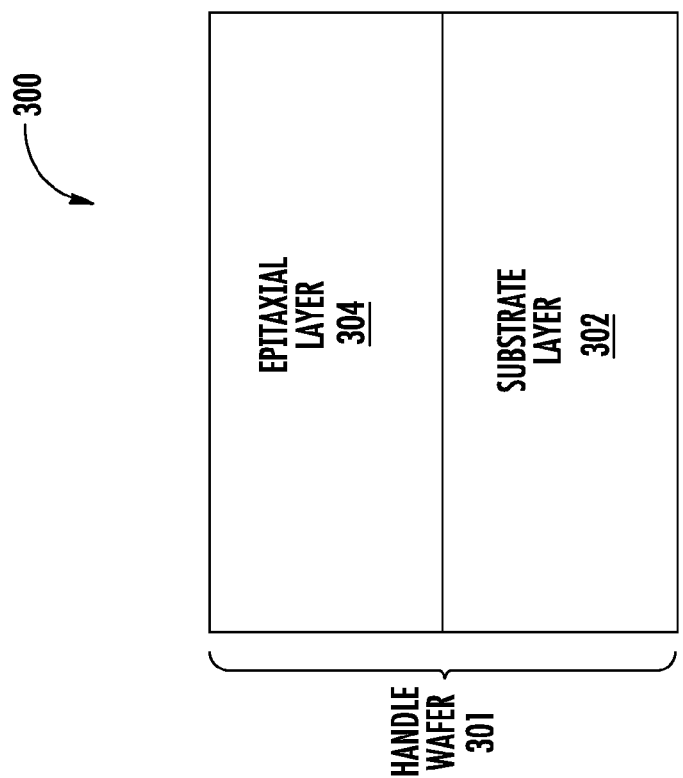

FIGS. 3A-3E are block diagrams illustrating one embodiment of a process 300 for forming a diode in a handle wafer. FIG. 3A illustrates the construction of a handle wafer 301 as process 300 forms an epitaxial layer 304 over a substrate layer 302. In one embodiment, process 300 fabricates substrate layer 302 from doped material. For example, substrate layer 302 is fabricated from either P+ doped material or N+ doped material. In some implementations, where the diode is used as a clamping diode, the polarity of substrate layer 302 determines whether the diode clamps to either ground or a voltage. Further, substrate layer 302 and epitaxial layer 304 are sufficiently thick to structurally support the layers of circuit wafer 313 that is deposited on top of handle wafer 301.

In certain embodiments, when process 300 forms epitaxial layer 304 on substrate layer 302, epitaxial layer 304 is of the same polarity as substrate layer 302, but is not as heavily doped. For example, when substrate layer 302 has a P+ doping, epitaxial layer 304 has a P− doping. Alternatively, when substrate layer 302 is doped with N+ material, epitaxial layer 304 is doped with N− material. The doping and thickness of epitaxial layer 304 depend on the desired characteristics of the diode formed in handle wafer 302. For example, when a zener diode is formed in handle wafer 302, the zener diode has particular voltage requirements. The voltage requirements of the zener diode determine the amount of doping and the thickness of epitaxial layer 304. The larger the voltage requirements for the diode, the larger the thickness of epitaxial layer 304.

In FIG. 3B, process 300 forms a doped region 306 in epitaxial layer 304. In one embodiment, to form doped region 306, a region of epitaxial layer 304 is implanted with a material having a polarity opposite to the polarity of epitaxial layer 304. For example, when epitaxial layer 304 is doped with P− material, doped region 306 is formed with N+ material. Conversely, when epitaxial layer 304 is doped with N− material, doped region 306 is formed with P+ material. In some implementations, when a zener diode is formed in epitaxial layer 304, doped region 306 is highly doped to lower the resistance of the zener diode when the zener diode is in saturation.

In certain embodiments, doped region 306 is formed to cover substantially the entire surface of epitaxial layer 304. When doped region 306 is formed over the entire surface of epitaxial layer 304, the edges of epitaxial layer 304 and associated tolerances are determined according to the requirements of the electrical device formed in handle wafer 301. Alternatively, in other embodiments, doped region 306 is formed at a selected location on epitaxial layer 304. When doped region 306 is formed at a selected location, a photoresist 308 masks epitaxial layer 304 to expose a region of epitaxial layer 304 limited to the selected location where doped region 306 will be formed. Doped region 306 is then formed at the selected location and photoresist 308 is removed upon the completion of the formation of doped region 306.

In FIG. 3C, process 300 forms further layers that are supported by epitaxial layer 304. For example, an isolation layer 310 is formed over epitaxial layer 304 and doped region 306. In certain implementations, isolation layer 310 is formed from a bonded oxide and provides a smooth surface for bonding a circuit wafer 313 to isolation layer 310. Alternatively, isolation layer 310 and circuit wafer 313 are formed using silicon on insulator technology. For example, the circuit wafer 313 is bonded to isolation layer 310, whereupon isolation layer 310 is bonded to handle wafer 302. Further, isolation layer 310 electrically isolates circuit wafer 313 formed on isolation layer 310 from the layers of handle wafer 302. As part of circuit wafer, an active layer 312 is formed on isolation layer 310. Active layer 312 is a layer of semiconductor material that has electrical devices formed therein. For example, active layer 312 is a layer of silicon, germanium, and the like. When the material for active layer 312 is deposited on isolation layer 310, the semiconductor material forming active layer 312 is polished, or etched back to the required thickness for building electrical devices therein. In an alternative implementation, a pre-fabricated active layer 312 is directly bonded to isolation layer 310, which is supported by handle wafer 301. Whether active layer 312 is formed on isolation layer 310 or a pre-fabricated active layer 312 is bonded to isolation layer 310, when active layer 312 is bonded to isolation layer 310, active circuitry is formed in active layer 312 using standard fabrication technology. For example, diodes are formed by implantation and diffusion in active layer 312. In certain implementations, DTIs 314 are formed through active layer 312 to electrically isolate the electrical devices formed in silicon layer 312 and any electrical connections that can be made through active layer 312. For example, DTIs 314 are formed by applying a photoresist to the top surface of active layer 312, where upon trenches are etched into active layer 312 between electrical devices formed in active layer 312. When the trenches are formed, electrically insulative material is deposited within the trenches to form DTIs 314. When DTIs 314 and the electrical devices are formed in active layer 312, a LOCOS layer 316 is then deposited on top of active layer 312 to electrically isolate active layer 312 from layers deposited on top of LOCOS layer 316.

In FIG. 3d, process 300 forms a via 317 to connect a device in handle wafer 301 to the top surface of LOCOS layer 316. In certain embodiments, to form via 317, a trench is formed through LOCOS layer 316 and active layer 312 to expose a portion of doped region 306. For example, a mask is applied to LOCOS layer 316, and a trench is formed by etching through LOCOS layer 316, silicon layer 312, and isolation layer 310 at a location on LOCOS layer 316 that will expose a portion of doped region 306. In at least one embodiment, when the doped region 306 is exposed, the exposed portion of doped region 306 is more heavily doped to form heavily doped region 307. For example, heavily doped region 307 is formed by doping the exposed portion of doped region 306 with a polarity that is the same as doped region 306. By more heavily doping the exposed portion of doped region 306, conductive material deposited within the trench forms a higher quality electrical contact with heavily doped region 307. For example, the conductive material deposited within the trench includes tungsten, copper, gold, and the like. Further, the deposition of conductive material forms a via 317 that connects heavily doped region 307 to the top surface of LOCOS layer 316. Also, DTIs 314 isolate via 317 from the other electronic devices in active layer 312.

Figure 3E:
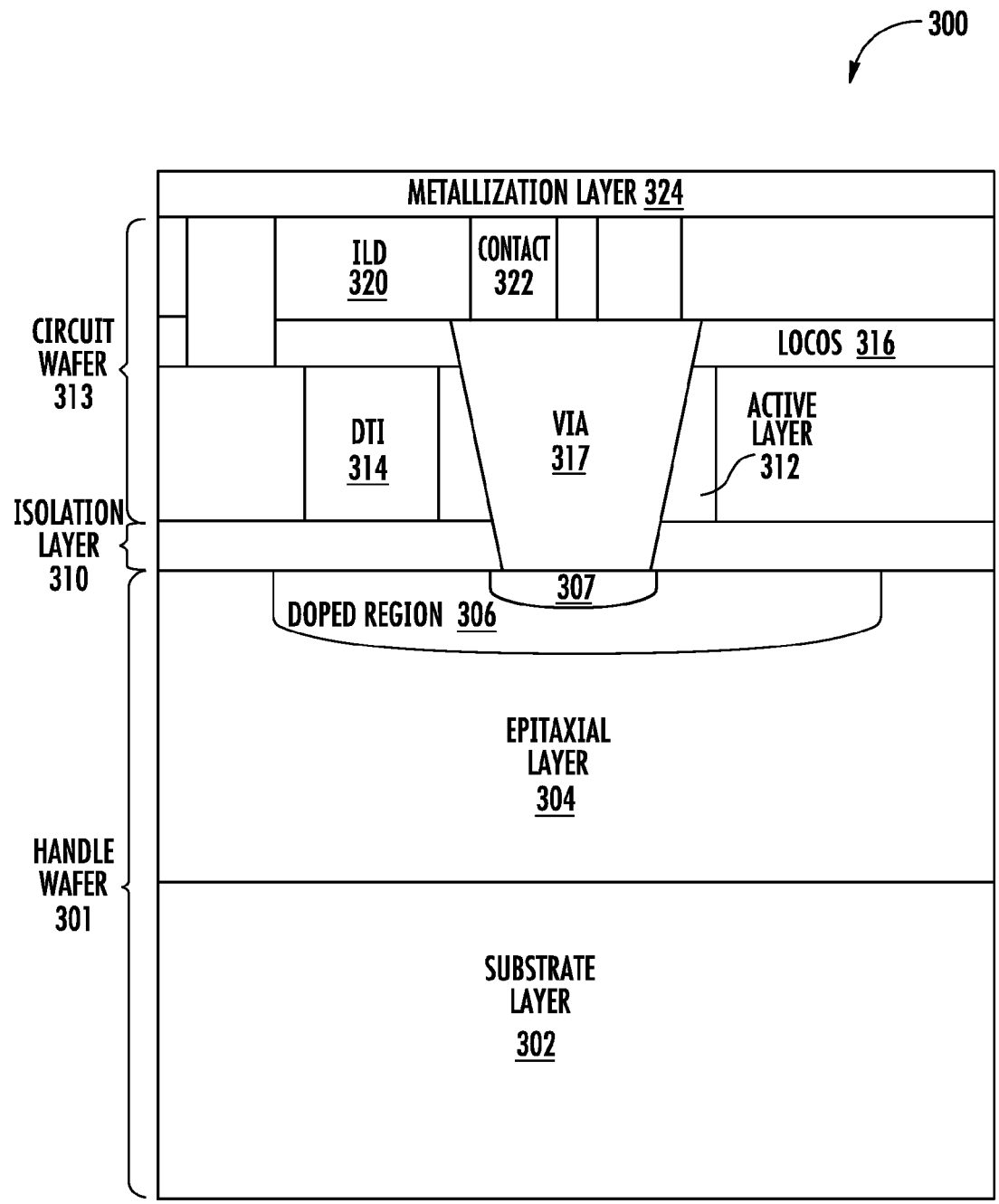

In FIG. 3E, the process 300 deposits further layers over the surface of LOCOS layer 316 and via 317. In one implementation, the fabrication process deposits an ILD 320 on top of LOCOS layer 316. When ILD 320 is deposited, a trench is formed through ILD 320 to expose a portion of via 317. Also, trenches are formed through ILD 320 and LOCOS 316 to expose portions of electrical devices formed in active layer 312. When the trenches are formed, conductive material is deposited within the trenches to form contacts 322. Contacts 322 electrically connect via 317 to the top surface of ILD 320. Also, contacts 322 connect electrical devices formed in active layer 312 to the top surface of ILD 320. When the contacts 322 are formed, a metallization layer 324 is patterned and etched over the top surface of ILD 320 to electrically connect the different devices in active layer 312 and devices formed in handle wafer 301 to form an electrical circuit.

Figure 4B:
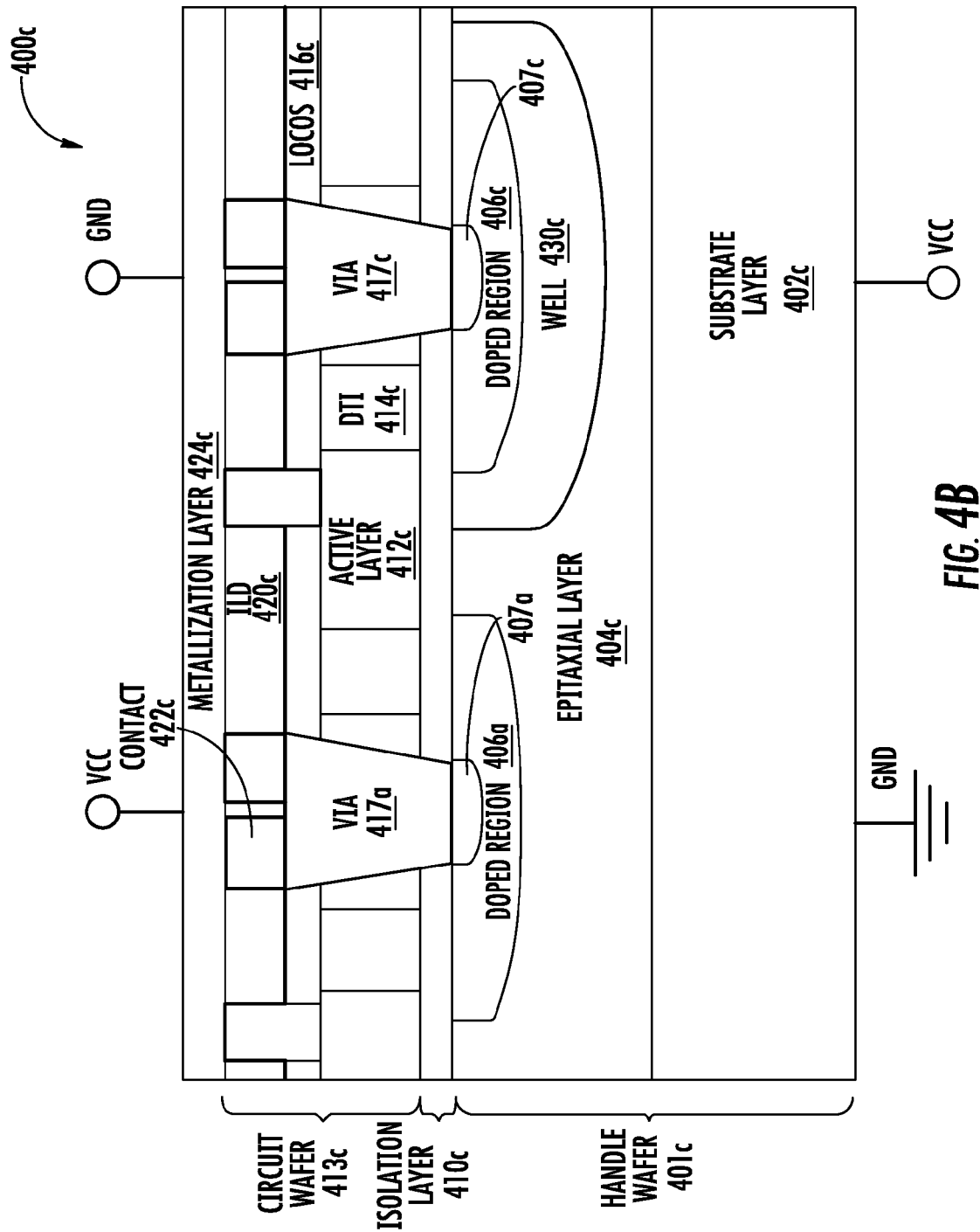

FIG. 4A is a diagram of a first clamping diode 400a and a second clamping diode 400b fabricated using the process described in relation to FIGS. 3A-3E. For example, isolation layers 410a and 410b are similar to isolation layer 310, active layers 412a and 412b are similar to active layer 312, vias 417a and 417b are similar to via 317, and contacts 422a and 422b are similar to contacts 322. Further, ILDs 420a and 420b are similar to ILD 320 and LOCOS 416a and 416b are similar to LOCOS 316. In certain embodiments, first clamping diode 400a and second clamping diode 400b are similar to one another except that the polarities of various layers in handle wafers 401a, 401b and in circuit wafers 413a and 413b are opposite to one another. For example, on first clamping diode 400a, substrate layer 402a has a P+ polarity and epitaxial layer 404a has a P− polarity. In contrast, on second clamping diode 400b, substrate level 402b has a N+ polarity and epitaxial layer 404b has a N− polarity. Similarly, the polarity of doped region 406a and heavily doped region 407a is opposite to the polarity of doped region 406b and heavily doped region 407b. Further, when diodes 400a and 400b are implemented in a transient voltage suppression circuit, diodes 400a and 400b are connected differently. For example, the metallization layer 424a of first clamping diode 400a connects to ground while substrate layer 402a connects to a voltage source. In contrast, the metallization layer 424b of second clamping diode 400b connects to a voltage source while substrate layer 402b connects to ground. The other components of first clamping diode 400a and second clamping diode FIG. 4B is a block diagram illustrating one embodiment of a device 400c where first clamping diode 400a and second clamping diode 400b in FIG. 4, are formed in the same substrate. Devices in circuit wafer 413c are formed as described in relation to FIGS. 3A-3E. For example, isolation layer 410c is similar to isolation layer 310, active layer 412c is similar to active layer 312, via 417c is similar to via 317 and contacts 422c are similar to contacts 322. Further, ILD 420c is similar to ILD 320 and LOCOS 416c is similar to LOCOS 316. In handle wafer 401, substrate layer 402c is similar to substrate layer 302. However, first clamping diode 400a is formed in epitaxial layer 404a, which has a different polarity than epitaxial layer 404b containing second clamping diode 400b. To form two different clamping diodes in a single epitaxial layer 404c, where one diode is formed in a surrounding epitaxial layer 404c that has a polarity that is opposite to the polarity of the other diode, a well 430c is formed in the epitaxial layer 404c under one of the first doped region 406a or the second doped region 406b. For example, doped region 406a is formed directly in epitaxial layer 404c, while well 430c is formed in epitaxial layer 404c under doped region 406c. Further, heavily doped regions 407a and 407c are doped in accordance with the doped region 406a and 406c that surrounds heavily doped region 407a and 407c. Further, when well 430c is formed in epitaxial layer 404c, well 430c is sufficiently large, such that the operation of the diode in the well does not interact with substrate layer 402c. For example, when well 430c is formed in epitaxial layer 404c, well 430c is sufficiently large such that the operation of second clamping diode through doped region 406c in well 430c does not interact with epitaxial layer 404a.

Figures 5A, 5B:
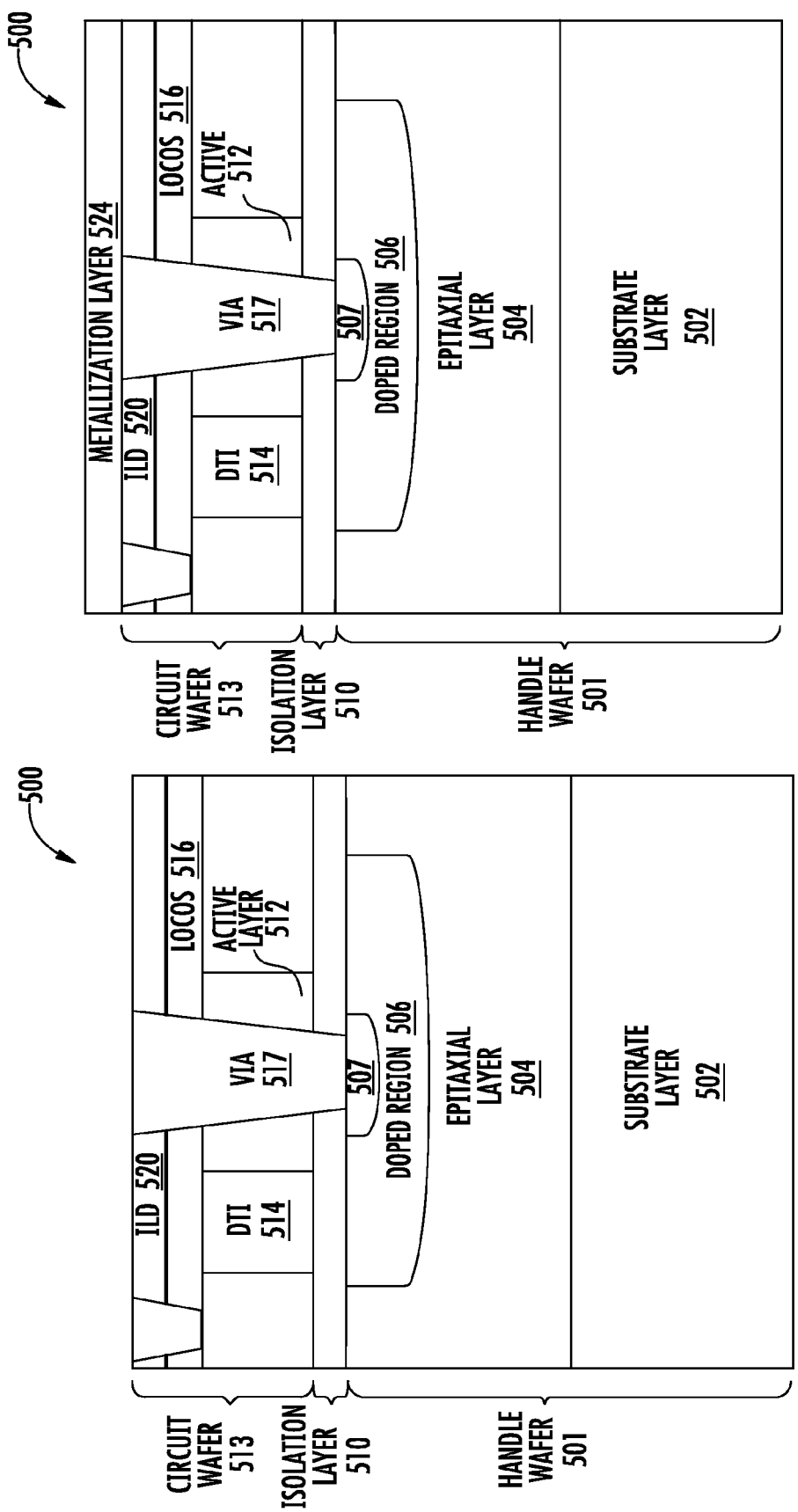
FIGS. 5A-5B are block diagrams illustrating one embodiment of a process for forming a diode in a handle wafer.

FIGS. 5A-5B are block diagrams illustrating one embodiment of a process 500 for forming a diode in a handle wafer. Process 500 is similar to process 300 as described in FIGS. 3A-3c. For example, process 500 fabricates a handle wafer 501, an isolation layer 510, DTIs 514, an active layer 512, and a LOCOS layer 516 in the same manner as described in relation to process 300. However, as shown in FIG. 5A, an ILD 520 is deposited over LOCOS layer 516 before the formation of the trench and subsequent deposition of conductive material to form via 517.

In certain embodiments, the trench is formed by masking the ILD 520, leaving exposed regions of the ILD 520 for etching, cutting, and the like. The trench is then formed through ILD 520, LOCOS layer 516, active layer 512, and isolation layer 510 to expose a portion of doped region 506 in epitaxial layer 504. When doped region 506 is exposed, the exposed portion of doped region 506 is more heavily doped to form heavily doped region 507. For example, heavily doped region 506 is formed by doping the exposed portion of doped region 506 with a polarity that is the same as doped region 506. By more heavily doping the exposed portion of doped region 506, conductive material deposited within the trench forms a higher quality electrical contact with doped region 506. For example, the conductive material deposited within the trench is similar to the material used to make via 317 in FIG. 3d. Further, the deposition of conductive material forms a via 517 that electrically connects heavily doped region 507 to the top surface of ILD 520. Also, DTIs 514 electrically isolate via 517 from other devices on the integrated circuit. In FIG. 5B, when via 517 is formed, a metallization layer 524 is deposited over ILD 520 and via 517 to form electrical connections between the device formed in handle wafer 501 and other electric devices on the integrated circuit.

Figure 6:
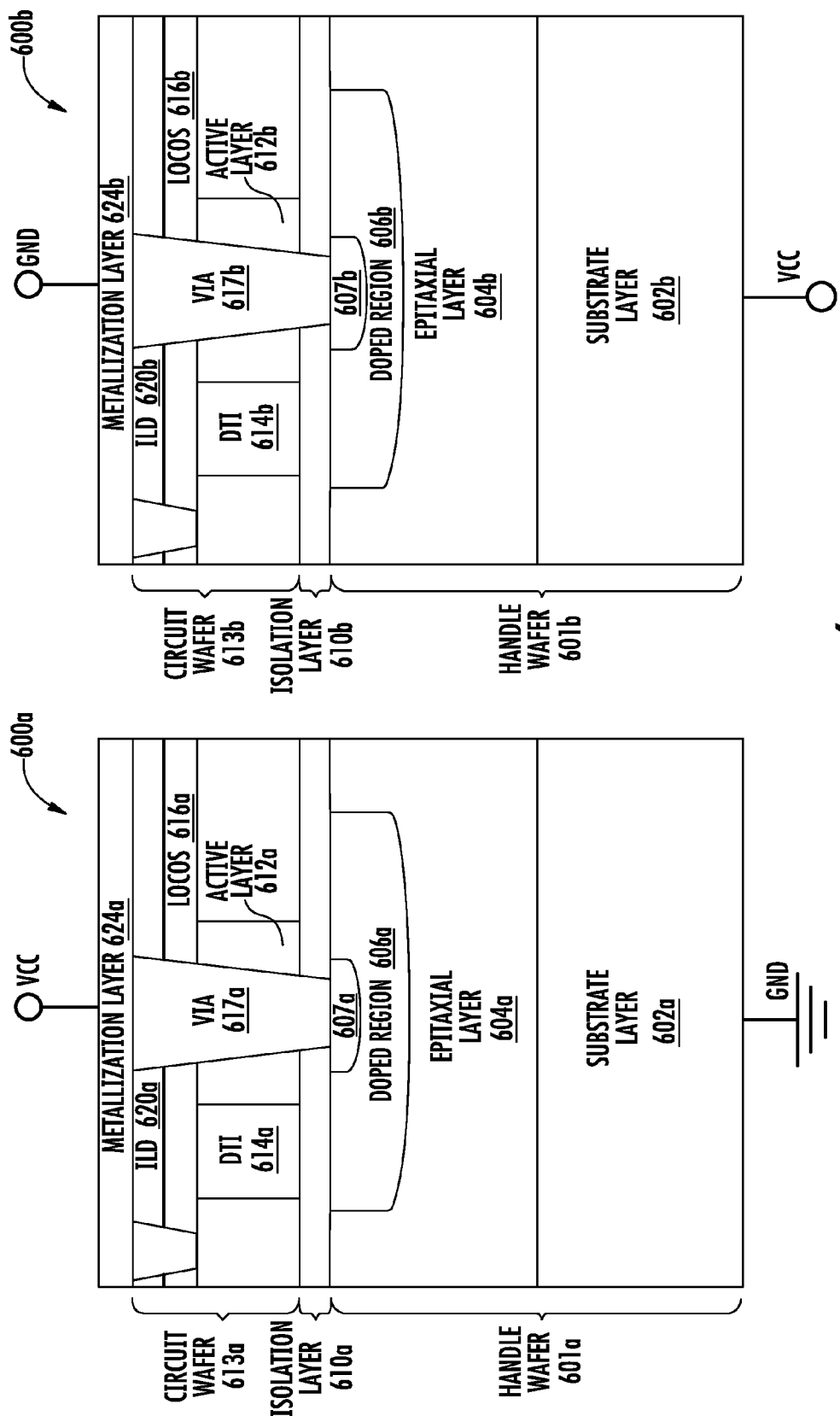
FIG. 6 is a block diagram illustrating embodiments of diodes formed in a handle wafer.

FIG. 6 is a diagram of a first clamping diode 600a and a second clamping diode 600b fabricated using the process described in relation to FIGS. 5A-5B. For example, isolation layers 610a and 610b are similar to isolation layer 510, active layers 612a and 612b are similar to active layer 512, and vias 617a and 617b are similar to via 517. Further, ILDs 620a and 620b are similar to ILD 520 and LOCOS 616a and 616b are similar to LOCOS 516. First clamping diode 600a and second clamping diode 600b are similar to one another except that the polarities of the various layers in handle wafer 401a and 401b and circuit wafer 413a and 413b are opposite to one another. For example, on first clamping diode 600a, substrate level 602a has a P+ polarity and epitaxial layer 604a has a P− polarity. In contrast, on second clamping diode 600b, substrate level 602b has a N+ polarity and epitaxial layer 604b has a N− polarity. Similarly, the polarity of doped region 606a and heavily doped region 607a is opposite to the polarity of doped region 606b and heavily doped region 607b. Further, when diodes 600a and 600b are implemented in a transient voltage suppression circuit, diodes 600a and 600b are connected differently. For example, the metallization layer 624a of first clamping diode 600a connects to ground while substrate layer 602a connects to a voltage source. In contrast, the metallization layer 624b of first clamping diode 600b connects to a voltage source while substrate layer 602b connects to ground. Further, in some embodiments, first clamping diode 600a and second clamping diode 600b are constructed on the same substrate as described in relation to FIG. 4B.

Figure 7A:
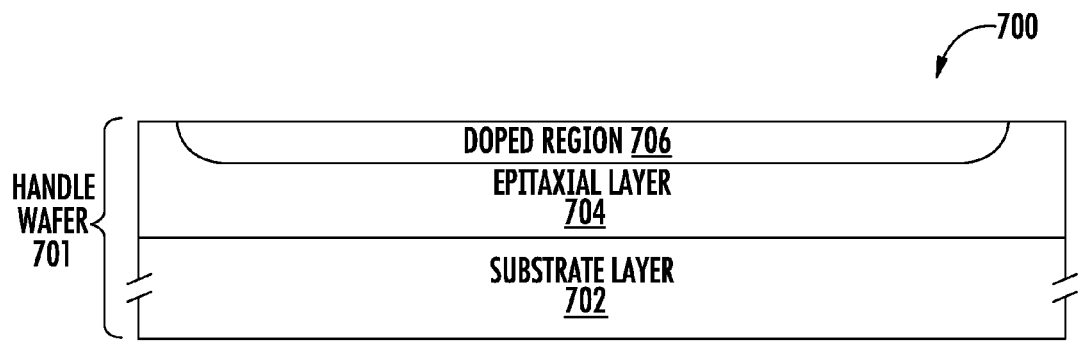
FIGS. 7A-7F are block diagrams illustrating one embodiment of a process for forming a diode in a handle wafer.
Figure 7B:
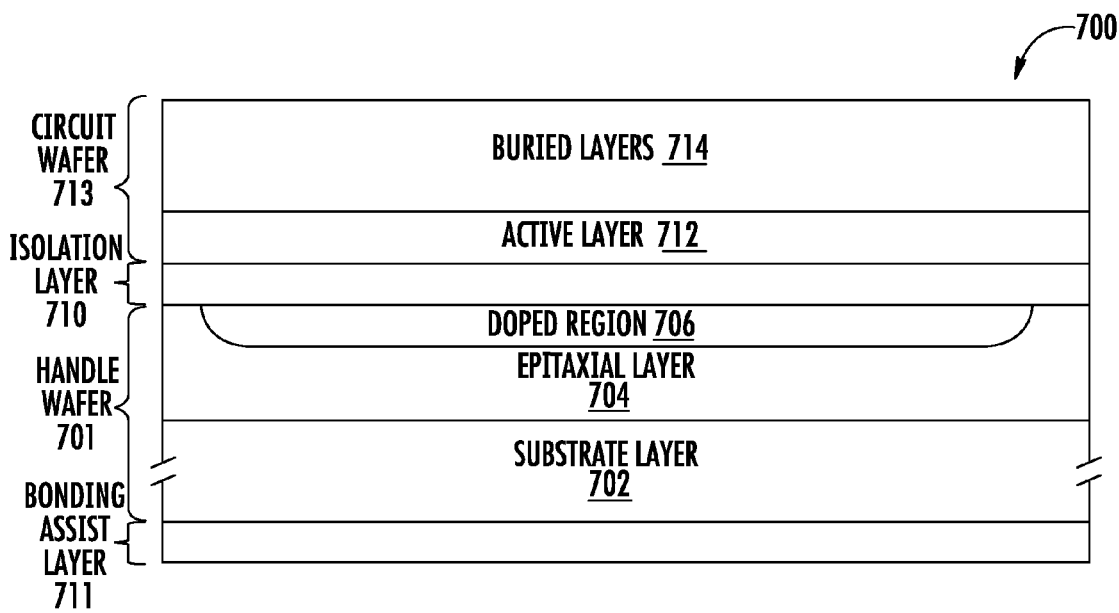

FIGS. 7A-7F illustrates a process 700 for fabricating a diode in a handle wafer 701 where a polysilicon via 717 electrically connects the doped region with the metallization layer. In FIG. 7A, the process 700 forms a doped region 706 in an epitaxial layer 704 of handle wafer 701, where the handle wafer 701 also includes a substrate layer 702 that supports epitaxial layer 704. The formation of substrate layer 702, epitaxial layer 704, and doped region 706 in epitaxial layer 704 are similar to the formation of substrate layer 302, epitaxial layer 304, and doped region 306 described in FIGS. 3A-3B. In some implementations, antimony is deposited in epitaxial layer 704 to form doped region 706. Further, in some embodiments, when a mask is used for implant 706, the mask exposes a large area of epitaxial layer 704, such that epitaxial layer 704 is exposed to within a predetermined distance of the edge of epitaxial layer 704. The exposure of a large area of epitaxial layer 704 leads to the creation of diodes with high capacitance. In some embodiments, doped region 706 is formed in epitaxial layer 704 using annealing, diffusion, implantation, and the like, In FIG. 7B, the process 700 continues with the formation of layers on handle wafer 701. For example, isolation layer 710, bonding assist layer 711, an active layer 712, and buried layers 714 are formed on handle wafer 701. Isolation layer 710 is similar to bonded oxide layer 310 as described in FIG. 3c. However, in contrast to bonded oxide layer 310, bonding assist layer 711 is also deposited on the bottom of handle wafer 701 to prevent handle wafer 701 from warping during the bonding of the materials. In some implementations, isolation layers 710 and 711 are of the same thickness, while in other implementations, the thickness varies between isolation layer 710 and bonding assist layer 711. Further, isolation layer 710 is ground, polished, etched, and the like in preparation for the construction of electronic devices in circuit wafer 213. When bonding layers 710 and 711 are deposited, an active layer 712 is bonded to bonding layer 710. Active layer 712 is then polished, or etched back to the required thickness for building electrical devices and buried layers 714 can be formed by deposition or implantation on active layer 712, which is supported by isolation layer 710. The buried layers 714 include p-type collector layers, a first epitaxial layer, a second epitaxial layer, N-sinks and P-sinks, and the like. In some implementations, buried layers 714 are formed through annealing, diffusion, implantation and the like.

Figure 7C:
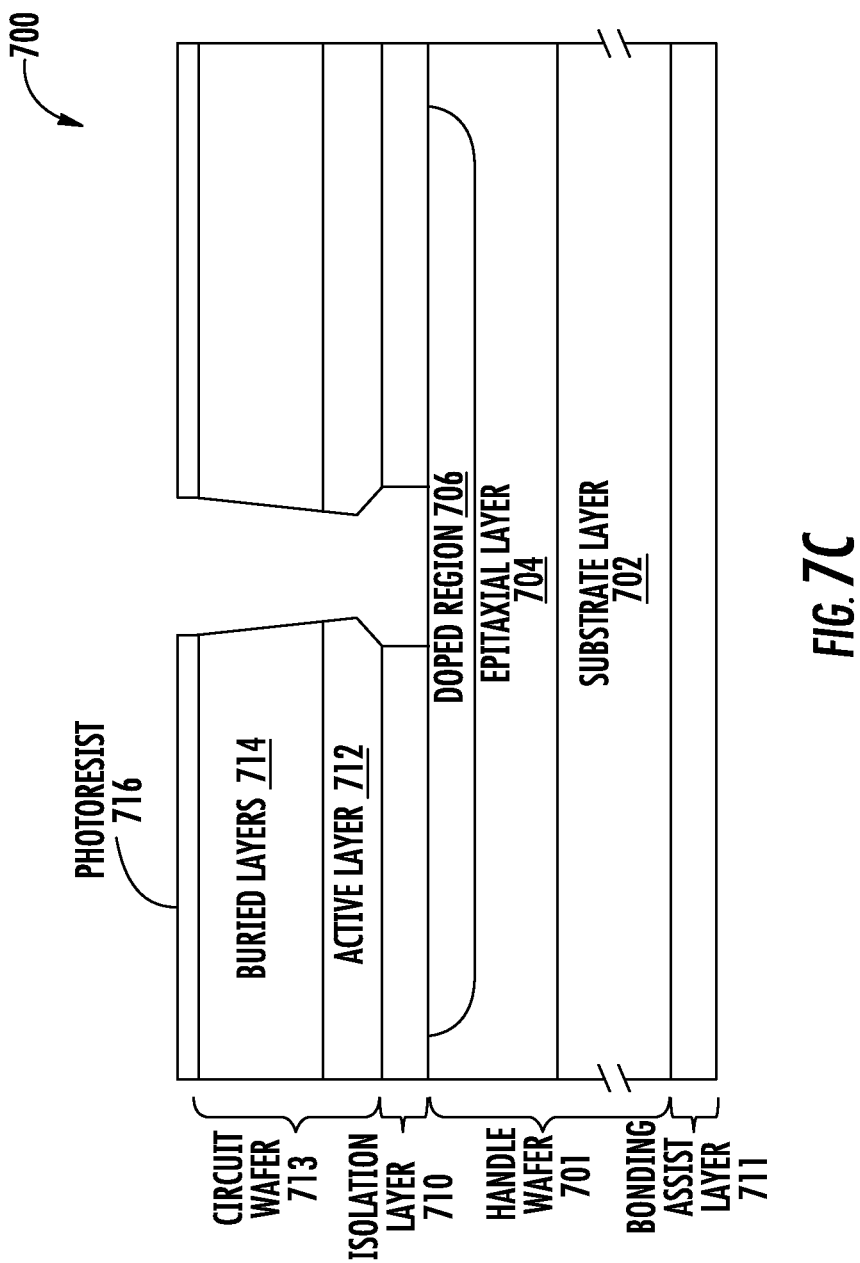
Figure 7D:
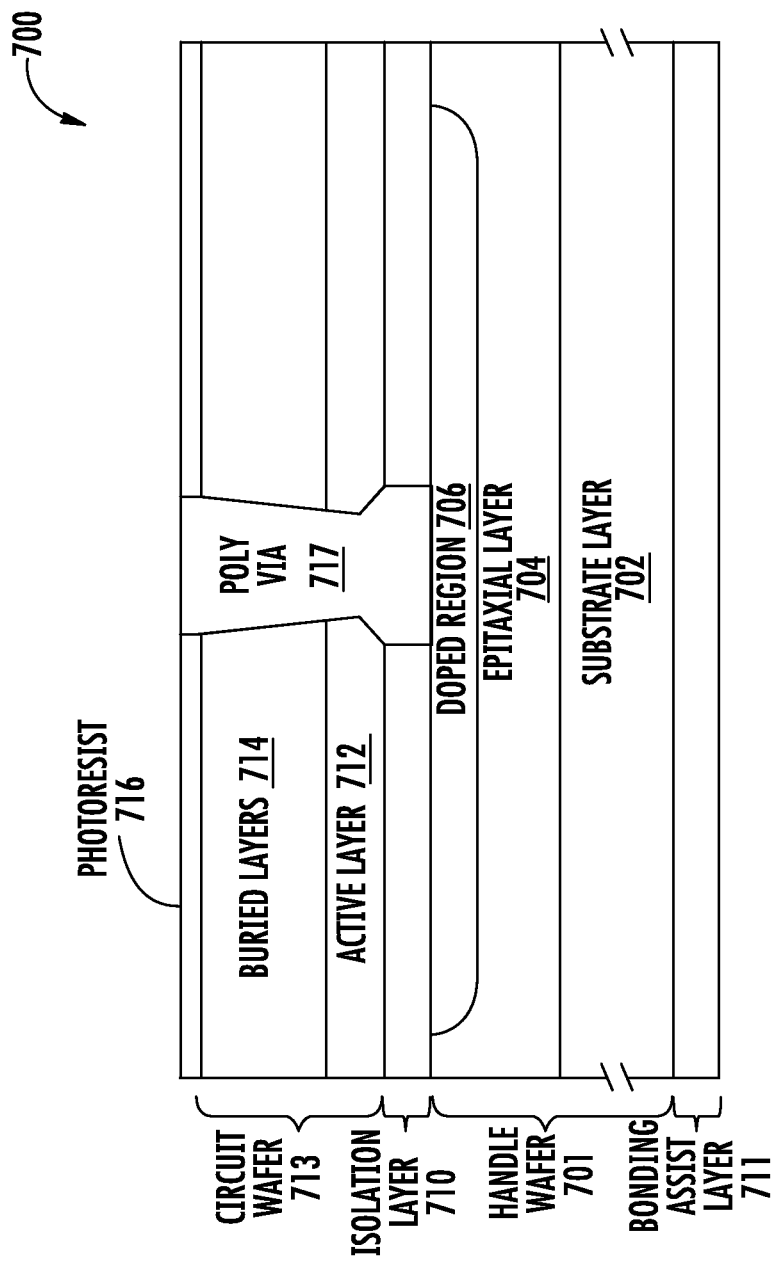

In FIG. 7C, process 700 exposes a portion of doped region 706. In certain embodiments, an oxide layer is deposited on the device and a photoresist 716 is applied that exposes a region of the oxide layer for etching. When the photoresist 716 is applied to the oxide layer, a trench is etched through multiple layers of the device to expose a portion of doped region 706. For example, the trench is formed through buried layers 714, active layer 712, and isolation layer 710. When a portion of doped region 706 is exposed due to the etching, photoresist 716 is removed. In FIG. 7D, process 700 forms a poly via 717. For example, when a trench exposes a portion of doped region 706, a poly material such as POCl3 doped poly is deposited within the trench to form poly via 717. In certain embodiments, poly via 717 is etched back to form a smooth surface with buried layers 714. Poly via 717 provides an electrical contact between doped region 706 formed in epitaxial layer 704 and the top surface of buried layers 714.

Figure 7E:
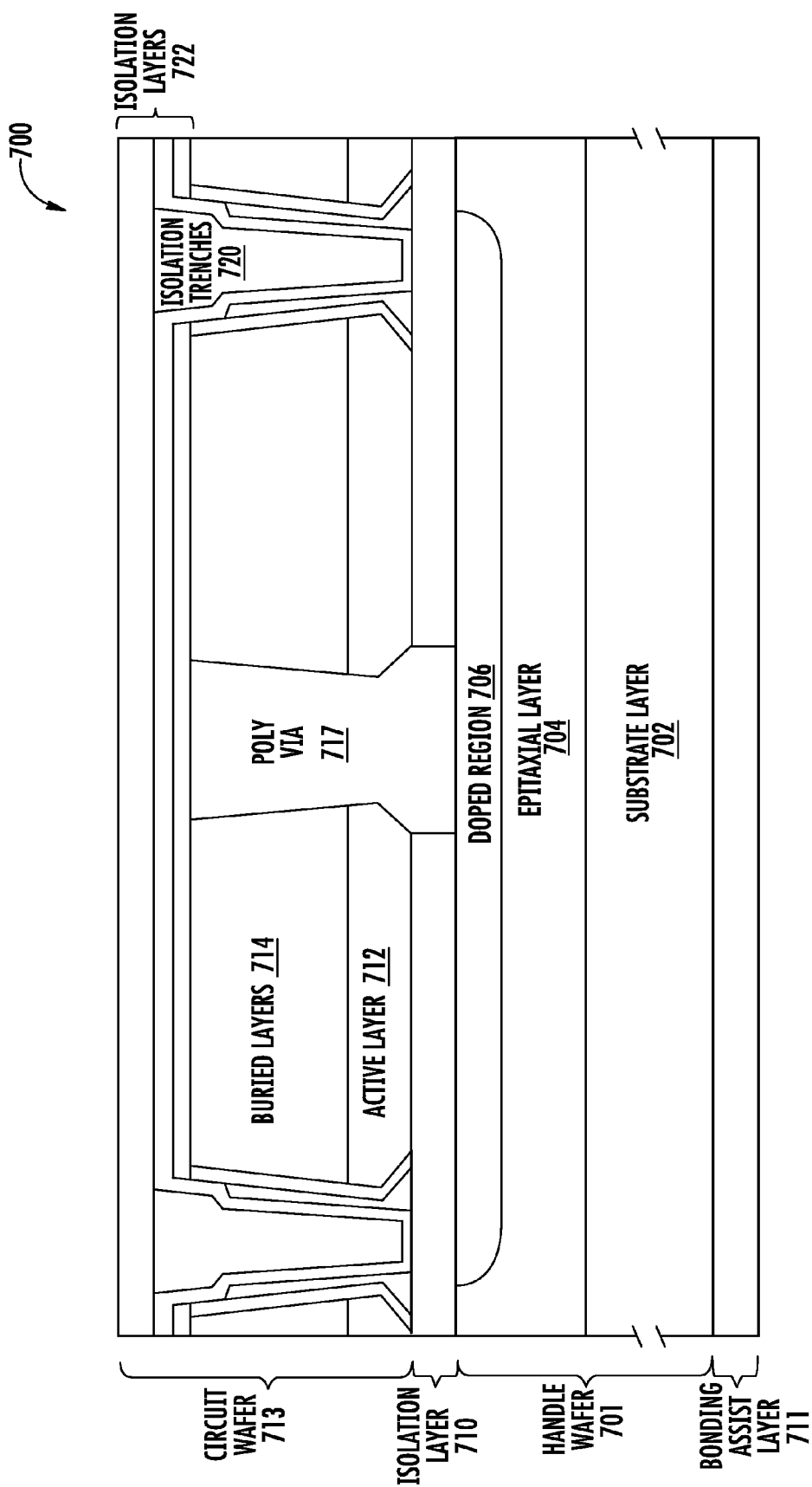

In FIG. 7E, process 700 electrically isolates poly via 717 and doped region 706. To electrically isolate poly via 717 and doped region 706, isolation trenches 720 are formed. To form isolation trenches 720, an oxide layer is stripped from the die, a photoresist is applied, and isolation trenches 720 surrounding poly via 717 are etched to vertically expose a portion of isolation layer 710. When the isolation trenches 720 are etched and a portion of isolation layer 710 is exposed, the applied photoresist is stripped from the die. Further, trench isolation layers 722 are deposited within the isolation trenches 720 and on the die. For example, in some embodiments, a sidewall oxide is deposited on the circuit, the trench is annealed, a thin poly is deposited, poly SPEB is deposited, trench low-pressure tetraethylorthosilicate (LPTEOS) is deposited, and the density of the tetraethylorthosilicate (TEOS) is increased. Further, when the trench isolation layers 722 are formed, isolation trenches 720 are filled with a poly material. In certain embodiments, the poly material is deposited within isolation trenches 720 and the top surface is smoothed through CMP planarization to remove extra poly that is deposited in the isolation trenches. Further, in some implementations, a LoTren implant is also deposited. After the deposition of poly within isolation trenches 720, a field TEOS layer is deposited over the integrated circuit and a field anneal is applied.

Figure 7F:
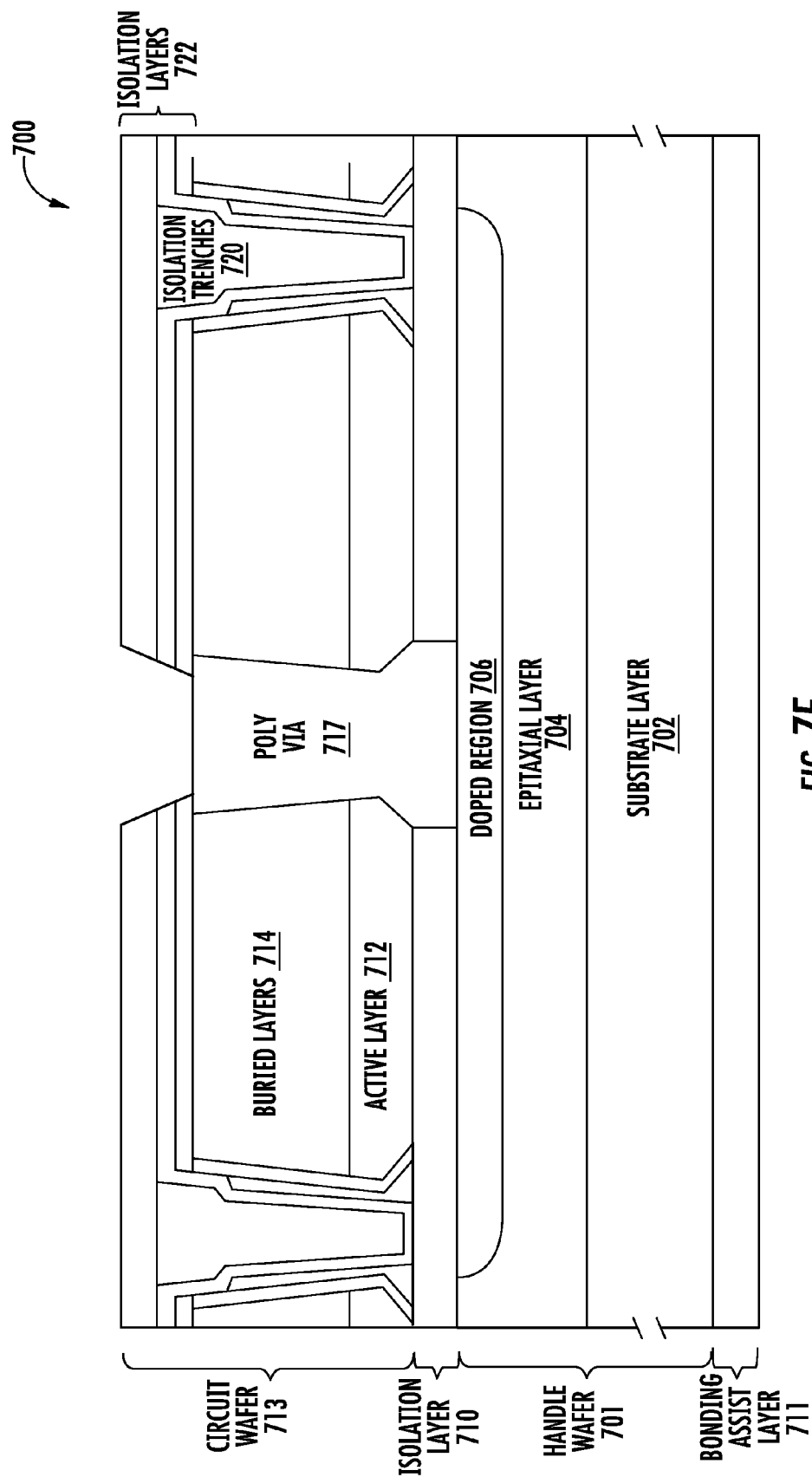

In FIG. 7F, process 700 electrically connects poly via 717 to the circuit. For example, a mask is applied to the top layer of the integrated circuit and the top layer is etched to expose poly via 717, which connects to doped region 706. Further, a standard trench contact layout can be used. When poly via 717 is exposed, poly via 717 can connect to other layers through deposited contacts and metallization layers such that doped region 706, formed in handle wafer 701, can function as a diode or other electrical device within an integrated circuit.

Figures 8, 9:
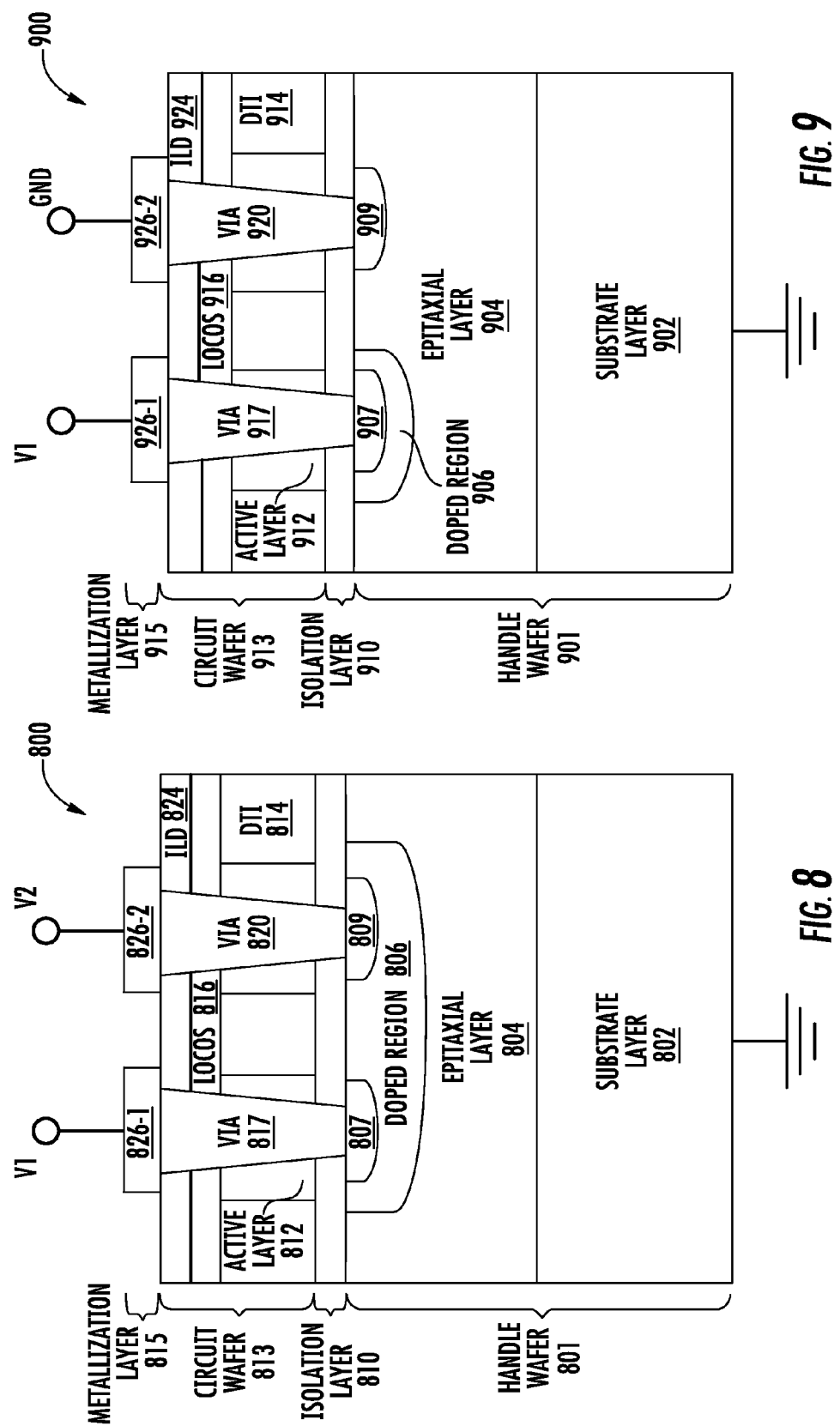
FIG. 8 is a block diagram illustrating one embodiment of a resistor fabricated on a handle wafer.
FIG. 9 is a block diagram illustrating one embodiment of a diode or capacitor fabricated on a handle wafer.

In certain embodiments, devices other than diodes can be fabricated within handle wafers. For example, FIGS. 8-12 illustrate cross sections of different embodiments for electronic devices formed in a handle wafer. For example, FIG. 8 illustrates the cross section of a diffusion resistor 800 formed in a handle wafer 801. In some implementations, diffusion resistor 800 is fabricated according to the same process as shown in relation to FIGS. 5A-5B. For example, DTIs 814, LOCOS layer 816, ILD layer 824 and active layer 812 are fabricated in a similar manner to corresponding structures DTIs 514, LOCOS layer 516, ILD layer 520, and active layer 512 in FIGS. 5A-5B. To fabricate diffusion resistor 800, two isolated vias 817 and 820 are formed that extend through circuit wafer 813 and isolation layer 810 to electrically connect a highly doped regions 807 and 809 with terminals 826-1 and 826-2 in a metallization layer 815. The first via 817 connects highly doped region 807 with V1 through terminal 826-1 and second via 820 connects highly doped region 809 with V2 through terminal 826-2. Further, the highly doped regions 807 and 809 are doped to have the same polarity as doped region 806, which has a different polarity than the polarity of the epitaxial layer 804 and substrate layer 802. The amount of doping of highly doped regions 807 and 809, along with doped region 806 control the amount of resistance provided by diffusion resistor 800.

FIG. 9 is a cross section view of one implementation of a device 900 formed in a handle wafer 901 that can be either an integrated diode or a junction capacitor, In a manner that is similar to diffusion resistor 800, device 900 is fabricated according to the same process as shown in relation to FIGS. 5A-5B. For example, DTIs 914, LOCOS layer 916, ILD layer 924 and active layer 912 are fabricated in a similar manner to corresponding structures DTIs 514, LOCOS layer 516, ILD layer 520, and active layer 512 in FIGS. 5A-5B. Also, for device 900, two isolated vias 917 and 920 are formed that extend through circuit wafer 913 and isolation layer 910 to electrically connect doped region 906 with terminals 926-1 and 926-2 in metallization layer 915. Doped region 906 and highly doped region 907 are fabricated as described above in relation to FIG. 5A-5B. However, to fabricate highly doped region 909, a trench is etched to expose a region of epitaxial layer 904 that is located near doped region 906. When the region of epitaxial layer 904 is exposed, heavily doped region 906 is more heavily doped with the same polarity of epitaxial layer 904 and substrate layer 902. When heavily doped region 909 is doped, the trench is filled to form second via 920, which, in some implementations, electrically connects contact region 909 with GND through terminal 926-2 in metallization layer 915.

Figure 11:
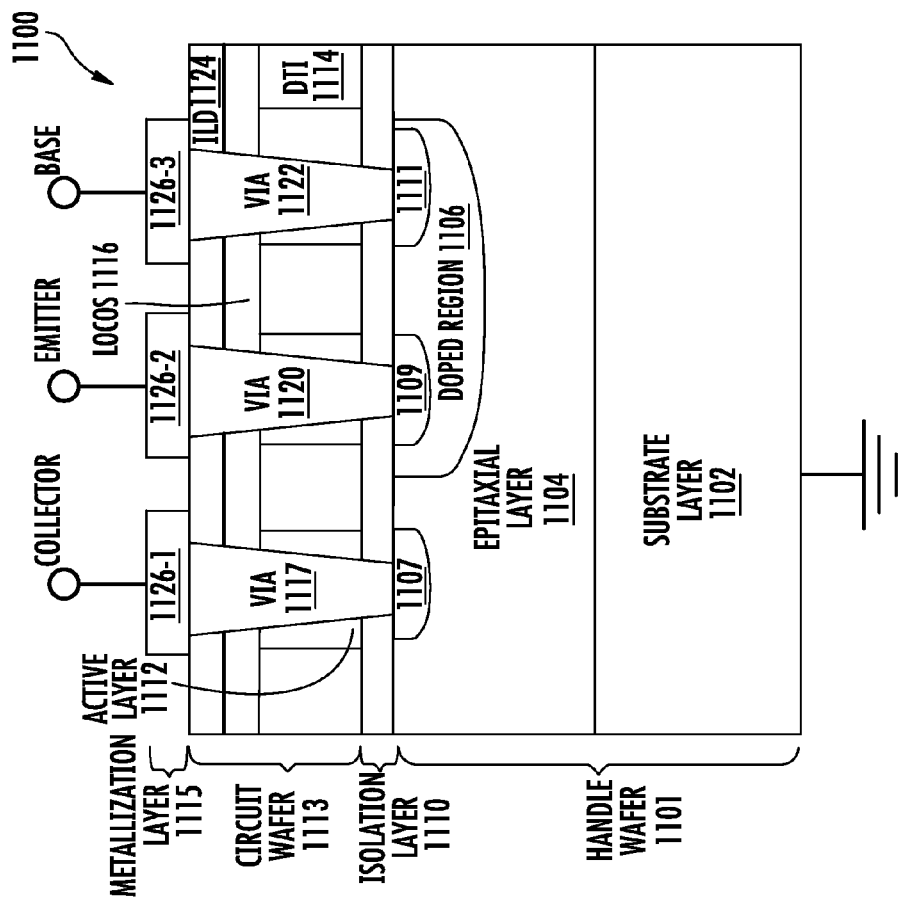
FIG. 11 is a block diagram illustrating one embodiment of a bipolar transistor fabricated on a handle wafer.
Figure 10:
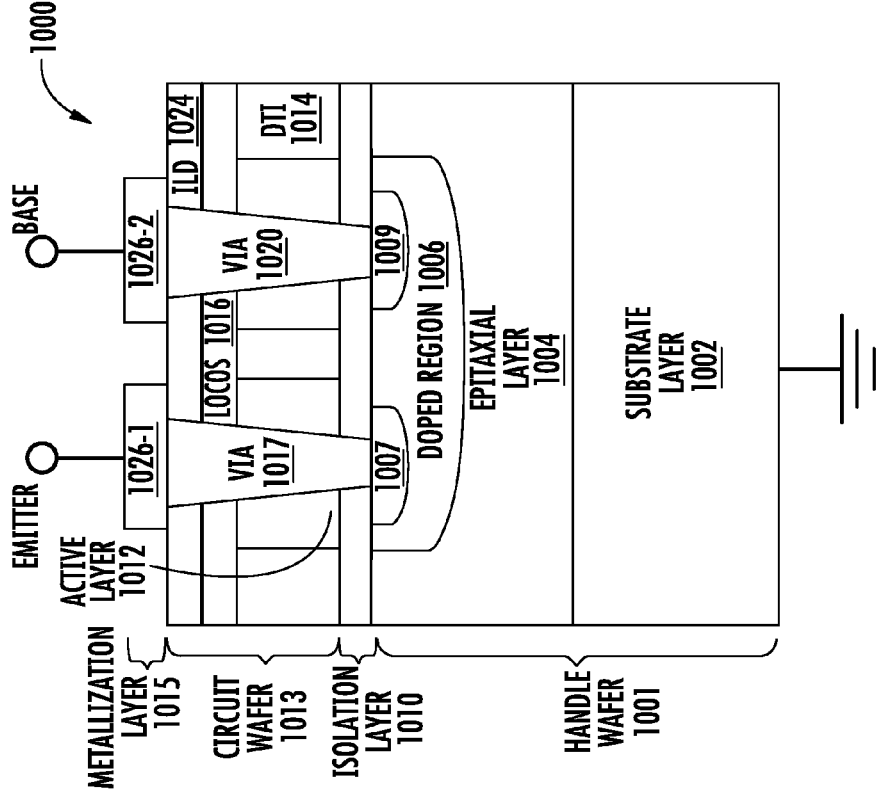
FIG. 10 is a block diagram illustrating one embodiment of a bipolar transistor fabricated on a handle wafer.
Figure 12:
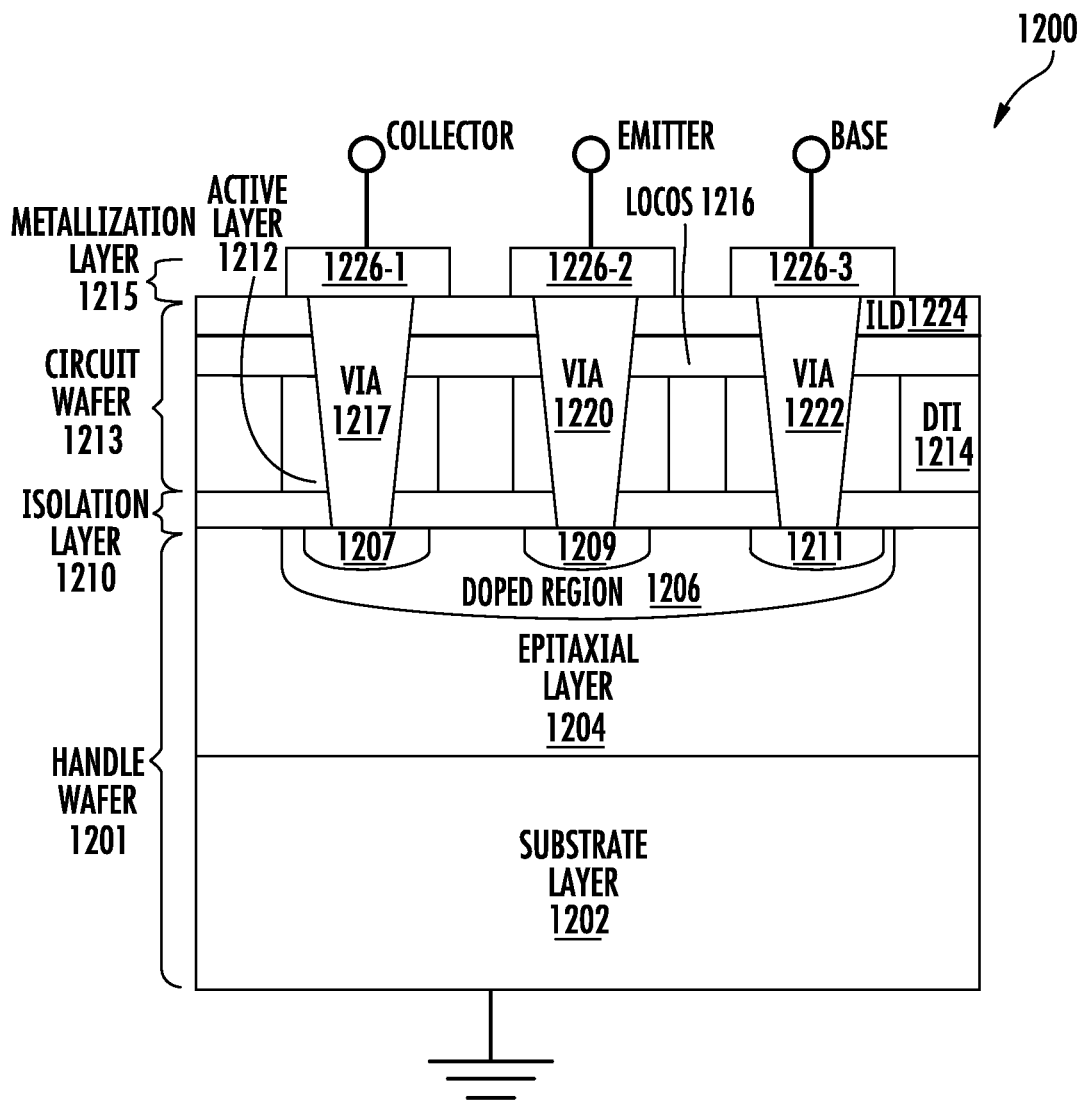
FIG. 12 is a block diagram illustrating one embodiment of a bipolar transistor fabricated on a handle wafer.

In further device embodiments, FIGS. 10-12 illustrate cross sections of different implementations of integrated bipolar transistors. FIG. 10 is a cross section view of one-implementation of an integrated bipolar transistor 1000 formed in a handle wafer 1001, where the integrated bipolar transistor has two terminals. Integrated bipolar transistor 1000 includes two separate highly doped regions 1009 and 1007. To form the highly doped regions 1009 and 1007 of integrated bipolar transistor 1000, a doped region 1006 is formed as described in relation to doped region 506 and doped region 1006 has a polarity that is opposite to the polarity of epitaxial layer 1004 and substrate layer 1002 as described in relation to FIG. 5A-5B. Further, DTIs 1014, LOCOS layer 1016, ILD layer 1024 and active layer 1012 are fabricated in a similar manner to corresponding structures DTIs 514, LOCOS layer 516, ILD layer 520, and active layer 512 in FIGS. 5A-5B. When highly doped regions 1007 and 1009 are doped after exposing doped region 1006, highly doped region 1007 is doped to have a polarity that is opposite from the polarity of doped region 1006 while highly doped region 1009 is more heavily doped while having the same polarity as doped region 1006. Further, terminals in a metallization layer 1015 extend through circuit wafer 1013 and isolation layer 1010 to electrically connect to highly doped regions 1007 and 1009. For example, the emitter terminal 1026-1 in metallization layer 1015 connects to highly doped region 1007 through a first via 1018 and the base terminal 1026-2 connects to highly doped region 1009 through a second via 1020.

FIG. 11 is a cross section view of one-implementation of an integrated bipolar transistor 1100 formed in a handle wafer 1101, where the integrated bipolar transistor has three terminals. Integrated bipolar transistor 1100 includes a base terminal 1126-3, an emitter terminal 1126-2, and a collector terminal 1126-1. The three terminals 1126-1, 1126-2 and 1126-3 extend through circuit wafer 1113 and isolation layer 1110 with vias 1117, 1120, and 1122 to electrically connect heavily doped regions 1107, 1109, and 1111 to a metallization layer 1115. Heavily doped regions 1109 and 1111, which connect to the emitter terminal 1126-2 and base terminal 1126-3, are formed in the same manner as highly doped regions 1007 and 1009 as described above in relation to FIG. 10. Further, heavily doped region 1107, which connects to collector terminal 1126-1, is formed similarly to heavily doped region 909 in FIG. 9 such that heavily doped region 1107 is formed in epitaxial layer 1104 proximate to a doped region 1106. Further, heavily doped region 1107 has the same polarity as epitaxial layer 1104 and substrate layer 1102. Also, layers in circuit wafer 1113 are fabricated similarly to layers in circuit wafer 513 described in FIGS. 5A-5B. Thus, DTIs 1114, LOCOS layer 1116, ILD layer 1124, and active layers 1112 are similar to corresponding structures DTIs 514, LOCOS layer 516, ILD layer 520, and active layer 512 in FIGS. 5A-5B.

FIG. 12 is a cross section view of one-implementation of an integrated bipolar transistor 1200 formed in a handle wafer 1201, where the integrated bipolar transistor has three terminals. Integrated bipolar transistor 1200 includes a base terminal 1226-3, an emitter terminal 1226-2, and a collector terminal 1226-1. The three terminals 1226-1, 1226-2 and 1226-3 extend through circuit wafer 1213 and isolation layer 1210 with vias 1217, 1220, and 1222 to electrically connect heavily doped regions 1207, 1209, and 1211 to a metallization layer 1215. Heavily doped regions 1209 and 1211, which connect to the emitter terminal 1226-2 and base terminal 1226-3, are formed in doped region 1206 in the same manner as highly doped regions 1007 and 1009 as described above in relation to FIG. 10. Further, heavily doped region 1207, which connects to collector terminal 1226-1, is also formed in doped region 1206. Further, heavily doped region 1207 has the same polarity as epitaxial layer 1204 and substrate layer 1202. Also, layers in circuit wafer 1213 are fabricated similarly to layers in circuit wafer 513 described in FIGS. 5A-5B. Thus, DTIs 1214, LOCOS layer 1216, ILD layer 1224, and active layers 1212 are similar to corresponding structures DTIs 514, LOCOS layer 516, ILD layer 520, and active layer 512 in FIGS. 5A-5B.

Figure 13:
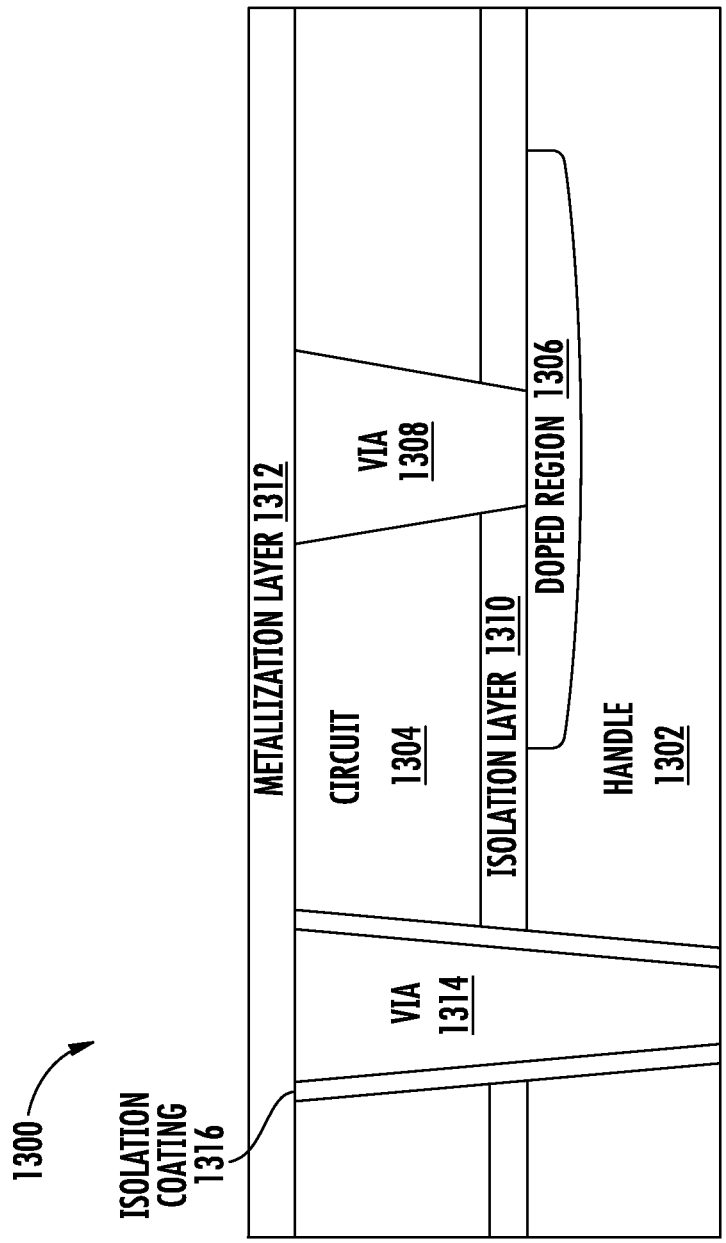
FIG. 13 is a block diagram illustrating one embodiment of a device formed on a handle wafer with an accompanying through handle wafer via.

FIG. 13 is one embodiment of a cross section of a device 1300 formed in a handle wafer 1402, where device 1300 further includes a via 1314 that connects a metallization layer 1312 to the bottom side of handle layer 1302. Device 1300 is formed similarly to device 100b in FIG. 1B. In certain embodiments, to form via 1314, before the deposition of metallization layer 1312, a trench is etched through, circuit wafer 1310, isolation layer 1310, and handle wafer 1302. When the trench is formed that extends from the top of circuit wafer 1304 to the bottom of handle wafer 1302, an isolation coating 1316 is formed on the surface of the trench. Isolation coating 1316 isolates material in the trench from coming into electrical contact with other electrical devices in circuit wafer 1304 and handle wafer 1302. For example, isolation coating 1316 prevents electrical connections between the material in trench 1314 and via 1308 and doped region 1306. When the trench is formed, a conductive material is deposited within the trench to form via 1314. When via 1314 is formed, a metallization layer 1312 is deposited on top of circuit wafer 1304 that connects via 1308 and via 1314 to other portions of an integrated or external circuit.

FIG. 14 is one embodiment of a device 1400 formed from multiple electronic components formed in handle wafers 1402 and 1422. In certain embodiments, different devices formed in handle wafers are stacked on top of one another. For example, device 1400 includes device 1300 as described in FIG. 13 stacked on top of device 100b described in FIG. 1B. By stacking the devices on top of one another, device 1400 conserves space. In at least one embodiment, device 1300 is separated from device 100b by an isolation layer 1418. Isolation layer 1418 electrically isolates device 1300 from device 1400. When a connection is made between device 1300 and device 100b, a via 1414 that extends through handle wafer 1322 also extends through isolation layer 1418 to electrically contact metallization layer 1412. Thus, devices 1300 and 100b electrically connect to one another only at desired locations.

Figure 15A:
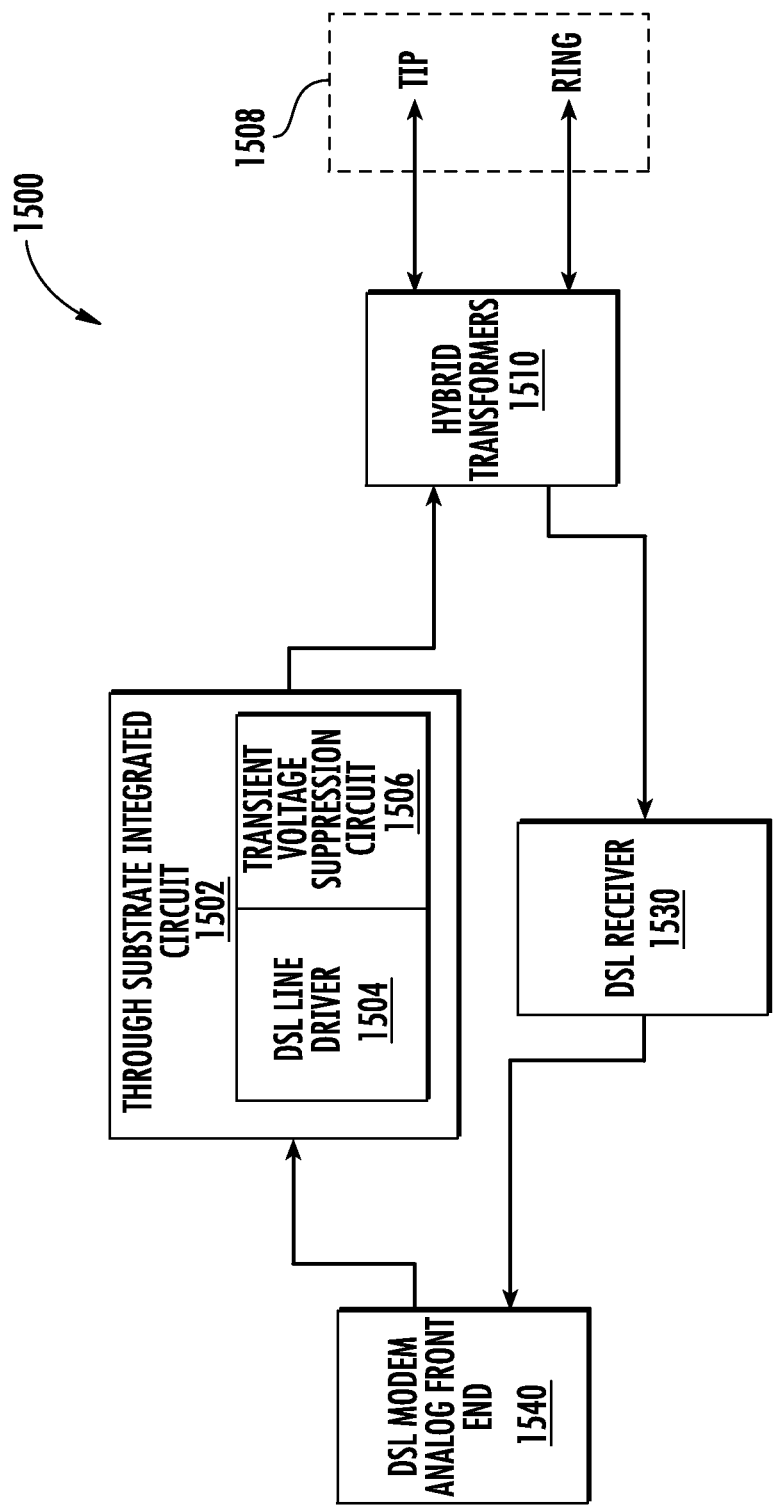
FIG. 15A is a block diagram of a system for receiving signals for a modem according to one embodiment.

FIG. 15A is a block diagram of one embodiment of a system 1500 for receiving and transmitting a signal from a DSL modem. System 1500 includes an integrated circuit 1502 that includes devices fabricated within a handle wafer. Integrated circuit 1502 includes a DSL line driver 1504 and a TVS circuit 1506. Integrated circuit 1502 receives analog signals from DSL modem analog front end 1540, which DSL line driver 1504 amplifies before the signals are transmitted across tip and ring lines 1508. Further, DSL modem analog front end 1540 receives an input signal from DSL receiver 1530, where DSL receiver 1530 receives input from tip and ring lines 1508. Further, hybrid transformers 1510 separate the signals transmitted from DSL line driver 1504 from the signals received from tip and ring lines 1508 to prevent the transmitted signals from overloading or adding noise to the received signal.

Figure 15B:
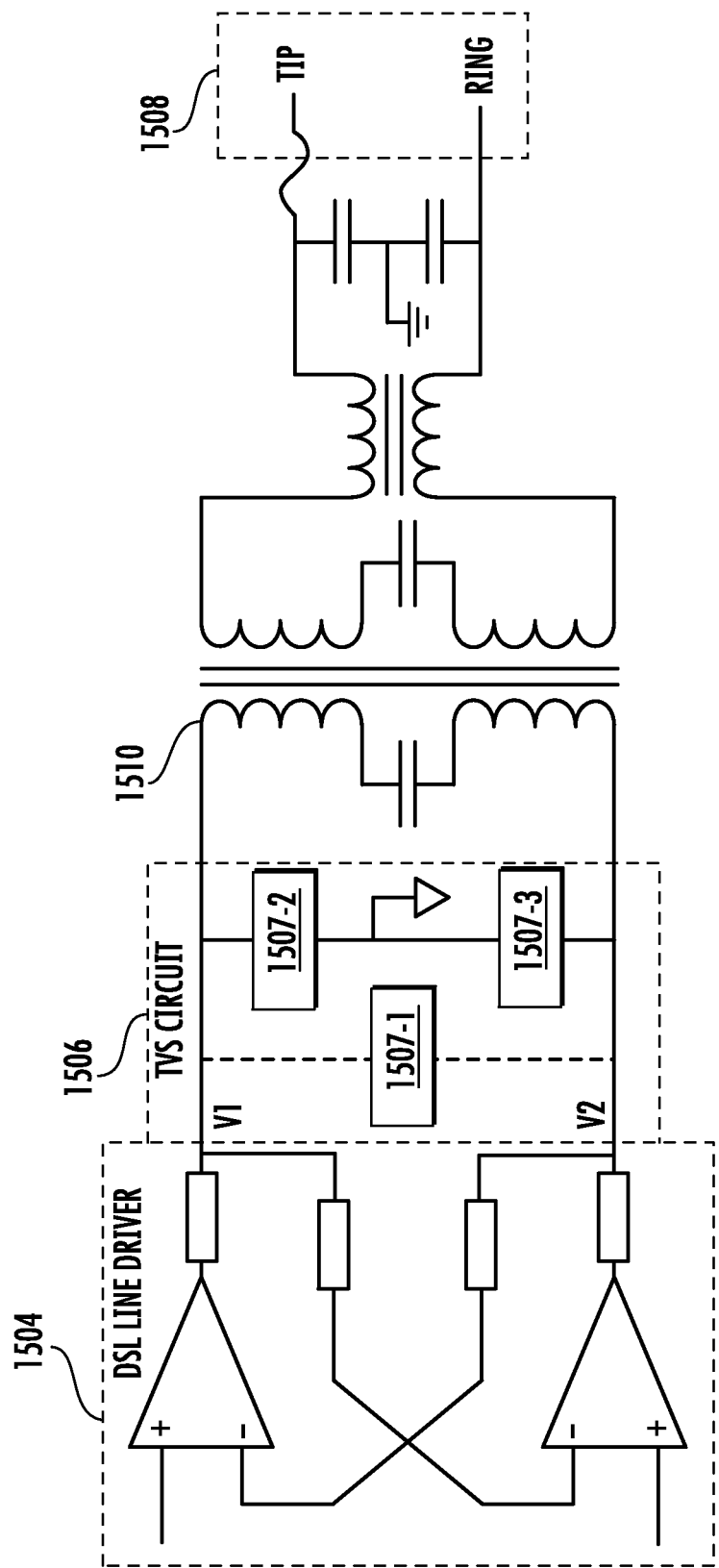
FIG. 15B is a schematic of one embodiment for a system as shown in FIG. 15A.

FIG. 15B is one embodiment of a schematic diagram of a portion of system 1500 that includes integrated circuit 1502, hybrid transformers 1510, and tip and ring lines 1508. In certain embodiments, integrated circuit 1502 includes DSL line driver 1504 and TVS circuit 1506. Integrated circuit couples to hybrid transformers 1510, which in turn couples to DSL Tip and Ring lines 1508.

DSL line driver 1504 drives a signal across DSL tip and ring lines 1508. To protect devices connected to the DSL lines 1508, TVS circuit 1506 coupled between DSL Lines 1508 and DSL line driver 1504 prevents power surges from being driven on DSL lines 1508. TVS circuit 1506 receives two voltages (V1 and V2) from DSL line driver 1504 and TVS circuit 1506 includes diodes 1507-1-1507-3, where diodes 1507-1-1507-3 respond to power surges by clamping surges on V1 and V2 to ground. Further, diodes 1507-1-1507-3 of TVS circuit 1506 are fabricated on integrated circuit 1502 that contains DSL line driver 1504 where at least one of the diodes is fabricated in a handle wafer.

Figure 15C:
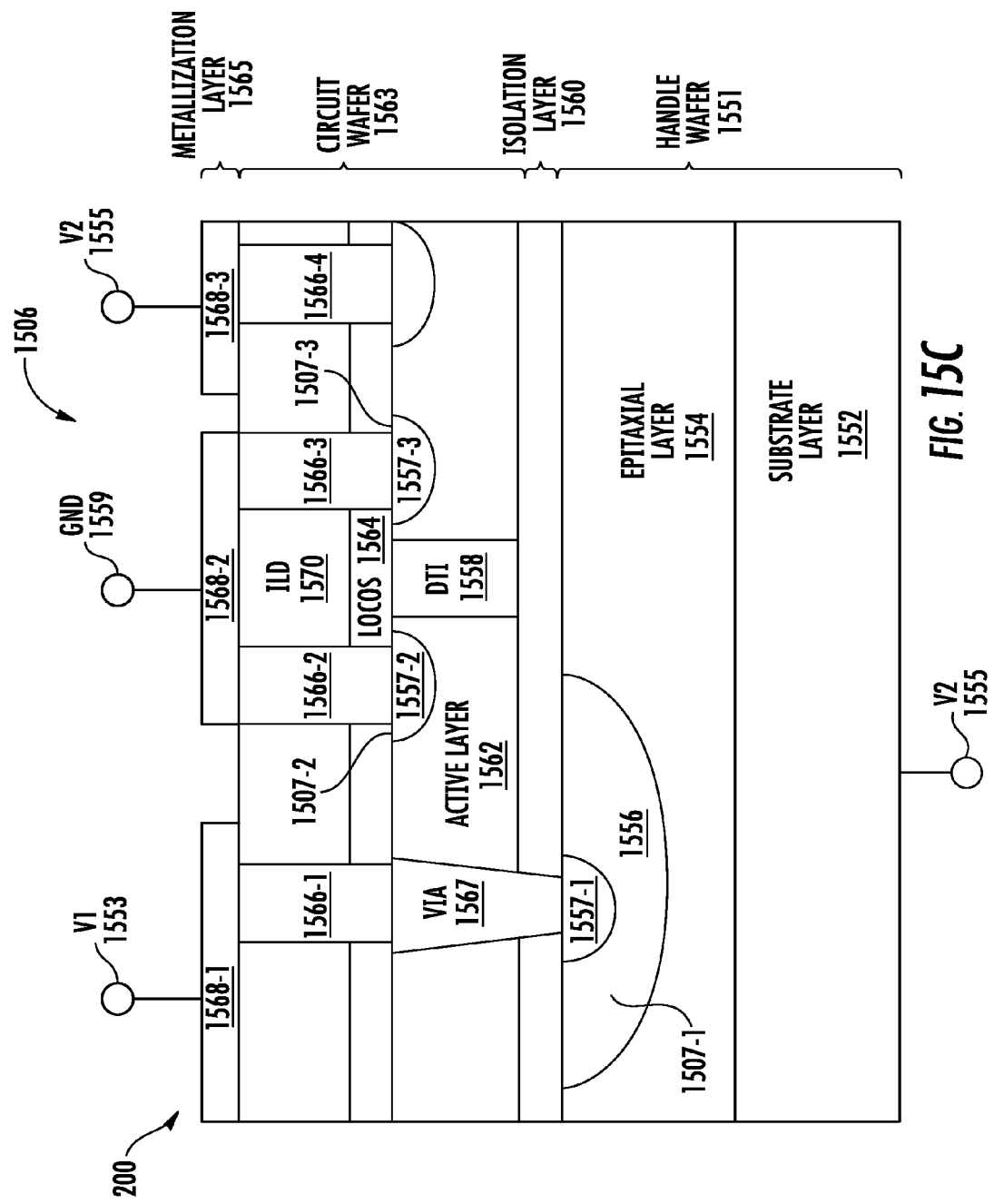
FIG. 15C is a block diagram illustrating one embodiment of transient voltage suppression circuit implementing a device formed in the handle wafer.

FIG. 15C is one embodiment of a cross sectional diagram of TVS circuit 1506, and coupling to V1 1553 and V2 1555. In certain embodiments, integrated circuit 1506 is manufactured similarly to integrated circuit 200 in FIG. 2. For example, handle wafer 1551, isolation layer 1560, circuit wafer 1563 are similar to handle wafer 201, isolation layer 210 and circuit wafer 213 in FIG. 2. In certain implementations, diode 1507-1 is formed in handle wafer 1551 by forming a doped region 1556 and a highly doped region 1557-1 in epitaxial layer 1554, where the polarity of doped region 1556 and highly doped region 1557-1 is opposite to the polarity of epitaxial layer 1554 and substrate layer 1552. Further, a via 1567-1 extends through active layer 1562 and isolation layer 1560 to provide an electrical connection between high highly doped region 1557-1 and the top of active layer 1562. In at least this particular exemplary embodiment, via 1567-1 connects to contact 1566-1 which provides an electrical connection from via 1567-1 to terminal 1568-1 in metallization layer 1565 and extends through LOCOS layer 1564 and ILD layer 1570. Terminal 1568-1 connects to V1 1553 while substrate layer 1552 is coupled to V2 1555.

Further, in certain embodiments, diodes 1507-2 and 1507-3 are formed in active layer 1562 as doped regions 1557-2 and 1557-3 in active layer 1562. In certain embodiments, a DTI 1558 is formed in between diodes 1507-2 and 1507-3, which electrically isolates diode 1507-2 and via 1567 from diode 1507-3. Contacts 1566-2 and 1566-3 connect diodes 1507-2 and 1507-3 to terminal 1568-2 through LOCOS layer 1564 and ILD layer 1570, where terminal 1568-2 connects to ground 1559. Further, contact 1566-4 extends from a portion of active layer 1562 that contains diode 1507-3 to terminal 1568-3, which connects to V2 1555. Therefore, integrated circuit 1506 in FIG. 15C implements circuit 1506 in FIG. 15B.

Figure 16:
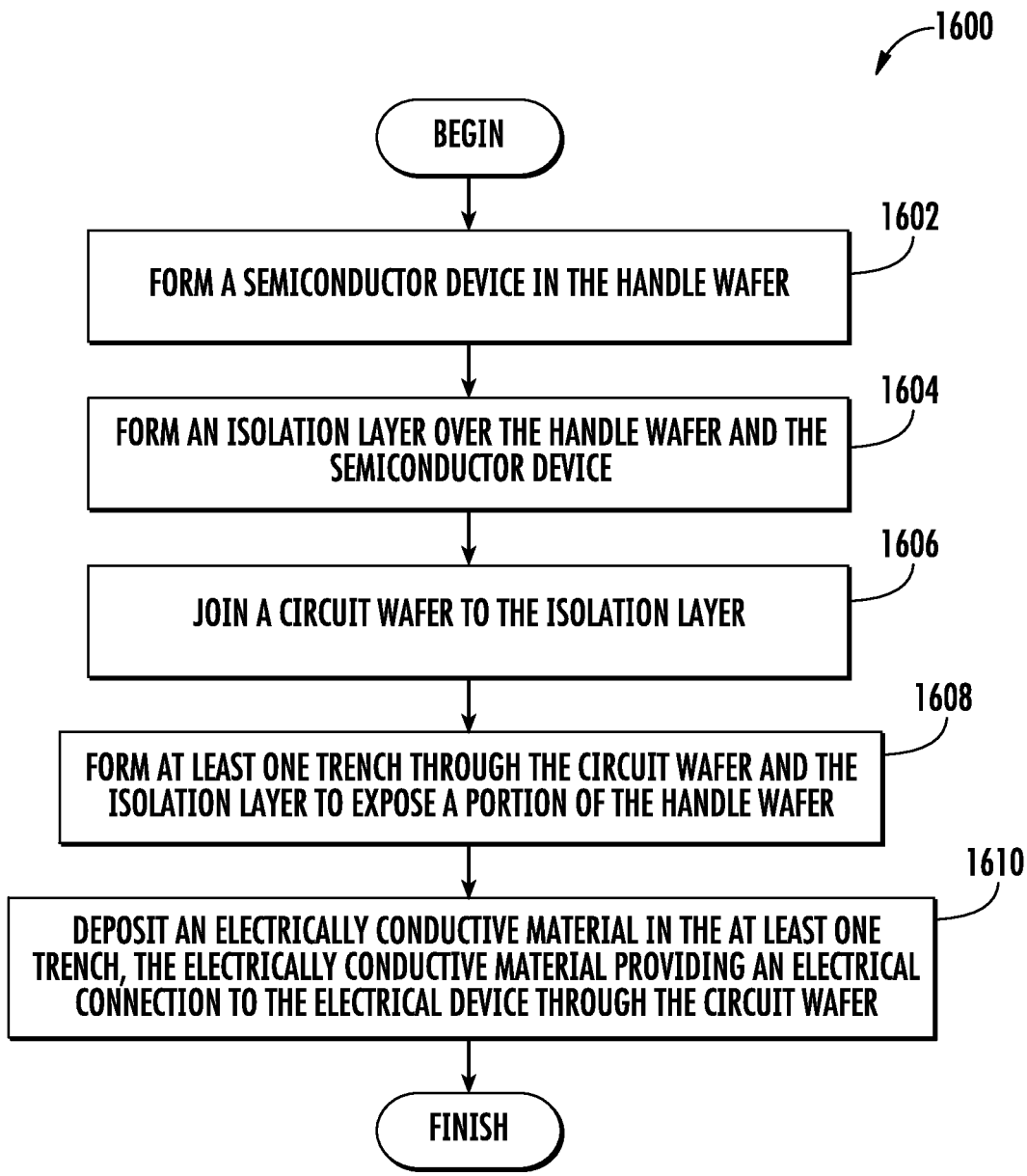
FIG. 16 is a flow diagram showing a method for forming devices on a handle wafer according to one embodiment.

FIG. 16 illustrates a flow diagram showing a method 1600 for forming electrical devices in handle wafers. Method 1600 begins at 1602 where a semiconductor device is formed in the handle wafer. At 1604 an isolation layer is deposited over the handle wafer and the semiconductor device. At 1606, a circuit wafer is joined to the isolation layer. In one implementation, the circuit wafer is bonded with the active devices already defined. Alternatively, the circuit wafer is processed after the active silicon substrate is bonded to the bonding layer. At 1608 at least one trench is formed through the circuit wafer and the isolation layer to expose a portion of the handle wafer. At 1610, an electrically conductive material is deposited in the at least one trench, the electrically conductive material providing an electrical connection to the electrical device through the circuit wafer.

Terms of relative position as used in this application are defined based on a plane parallel to the conventional plane or working surface of a wafer or substrate, regardless of the orientation of the wafer or substrate. The term "horizontal" or "lateral" as used in this application is defined as a plane parallel to the conventional plane or working surface of a wafer or substrate, regardless of the orientation of the wafer or substrate. The term "vertical" refers to a direction perpendicular to the horizontal. Terms such as "on," "side" (as in "sidewall"), "higher," "lower," "over," "top," and "under" are defined with respect to the conventional plane or working surface being on the top surface of the wafer or substrate, regardless of the orientation of the wafer or substrate.

Although specific embodiments have been illustrated and described herein, it will be appreciated by those of ordinary skill in the art that any arrangement, which is calculated to achieve the same purpose, may be substituted for the specific embodiments shown. Therefore, it is manifestly intended that this invention be limited only by the claims and equivalents thereof.

What is claimed:

1. A method for forming an electrical device in a handle wafer, the method comprising:
    forming a doped region in a handle wafer;
    forming an isolation layer over the handle wafer and the doped region;
    joining a circuit wafer to the isolation layer, wherein the circuit wafer contains multiple layers that form at least one semiconductor device that is electrically insulated from the handle wafer by the isolation layer, wherein the doped region extends through the handle wafer to a portion of the handle wafer that is closest to a semiconductor device in the at least one semiconductor device, wherein the semiconductor device and the doped region are separated by the isolation layer;
    forming at least one trench through a portion of the circuit wafer and the isolation layer to expose a portion of the doped region in the handle wafer; and
    depositing an electrically conductive material in the at least one trench, the electrically conductive material providing an electrical connection to the doped region through the circuit wafer and the isolation layer.

2. The method of claim 1, forming a well in the handle wafer, wherein the well is of a different polarity than the handle wafer and the doped region is formed in the well.

3. The method of claim 1, wherein forming the doped region comprises:
    applying a photoresist to the top surface of the handle wafer, the photoresist exposing a selective location of the handle wafer;
    forming the doped region in the exposed selective location; and
    removing the photoresist.

4. The method of claim 1, wherein the doped region has the opposite polarity as the polarity of the handle wafer.

5. The method of claim 1, further comprising forming a highly doped region in the doped region, wherein the highly doped region is formed by doping the doped region through the at least one trench in the circuit wafer.

6. The method of claim 5, wherein the highly doped region has the same polarity as the doped region.

7. The method of claim 1, wherein the doped region forms part of at least one of:
    a diode;
    a resistor;
    a field-effect transistor;
    a bipolar transistor; and
    a capacitor.

8. The method of claim 1, further comprising forming a highly doped region in the handle wafer, wherein the highly doped region is formed by doping the handle wafer through the at least one trench in the circuit wafer.

9. The method of claim 1, wherein the electrically conductive material is at least one of:
    a metal; and
    a poly-fill.

10. The method of claim 1, further comprising depositing a metallization layer over the electrically conductive material.

11. The method of claim 1, further comprising connecting the electrical connection to an integrated circuit.

12. The method of claim 11, wherein connecting the electrical connection to the integrated circuit comprises:
   forming a via through the circuit wafer and, the isolation layer, and the handle wafer; and
   depositing a metallization layer over the circuit wafer that electrically connects the via to the electrical connection.

13. The method of claim 11, wherein connecting the electrical connection to the integrated circuit comprises:
   stacking a second integrated circuit on top of the circuit wafer such that the electrical connection couples to the integrated circuit.

14. The method of claim 1, further comprising when the circuit wafer is joined to the isolation layer, forming another electrical device in the circuit wafer.

15. The method of claim 1, wherein the circuit wafer includes at least one of:
   an interlayer dielectric layer;
   an active layer;
   a trench isolator; and
   a local oxidation of silicon layer.

* * * * *